US012648338B2

(12) United States Patent
Song et al.

(10) Patent No.: US 12,648,338 B2
(45) Date of Patent: Jun. 2, 2026

(54) DISPLAY DEVICE

(71) Applicant: LG Display Co., Ltd., Seoul (KR)

(72) Inventors: JiHun Song, Seoul (KR); Jaehyeong Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 467 days.

(21) Appl. No.: 18/481,859

(22) Filed: Oct. 5, 2023

(65) Prior Publication Data

US 2024/0122040 A1 Apr. 11, 2024

(30) Foreign Application Priority Data

Oct. 6, 2022 (KR) ......................... 10-2022-0127641

(51) Int. Cl.
H10K 59/80 (2023.01)
H10K 59/131 (2023.01)
H10K 77/10 (2023.01)
H10K 102/00 (2023.01)

(52) U.S. Cl.
CPC ......... H10K 59/873 (2023.02); H10K 59/131 (2023.02); H10K 59/871 (2023.02); H10K 77/111 (2023.02); *H10K 2102/311* (2023.02)

(58) Field of Classification Search
CPC .. H10K 59/873; H10K 59/131; H10K 59/871; H10K 77/111; H10K 2102/311; H10K 50/844; H10K 59/12; H10K 77/10; H10K 50/841; H10K 59/122; H10K 59/124
See application file for complete search history.

(56) References Cited

U.S. PATENT DOCUMENTS

| | | | |
|---|---|---|---|
| 2013/0208207 A1 | 8/2013 | Okamoto et al. | |
| 2018/0144950 A1* | 5/2018 | Jeong | H10P 76/202 |
| 2018/0159075 A1* | 6/2018 | Kim | H10D 86/411 |
| 2022/0162467 A1* | 5/2022 | Lee | C09D 11/36 |
| 2023/0071194 A1 | 3/2023 | Kim et al. | |

FOREIGN PATENT DOCUMENTS

| | | |
|---|---|---|
| KR | 10-2017-0135682 A | 12/2017 |
| KR | 10-2023-0034700 A | 3/2023 |

OTHER PUBLICATIONS

Ministry of Intellectual Property of Korea, Office Action, Korean Patent Application No. 10-2022-0127641, Feb. 4, 2026, 11 pages.

* cited by examiner

*Primary Examiner* — Donald L Raleigh
(74) *Attorney, Agent, or Firm* — Fenwick & West LLP

(57) ABSTRACT

According to an aspect of the present disclosure, a display device includes a substrate which includes an active area including a plurality of sub pixels and a non-active area enclosing the active area and comprises a transparent conductive oxide; an inorganic insulating layer on the substrate; a protection pattern covers an end of the substrate and an end of the inorganic insulating layer; and an organic insulating layer on the substrate, the inorganic insulating layer, and the protection pattern and extends to the outside of the substrate in a partial area.

21 Claims, 14 Drawing Sheets

100

CF(CFR,CFG,CFB)
DL(DL1,DL2,DL3,DL4)
DP(TR1,TR2,TR3,SC)

900

140

180
130
115
114
RTL
IN
110
150

990

1000

180
130
115
114
RTL
IN
110
150
140
1090

DISPLAY DEVICE

CROSS-REFERENCE TO RELATED APPLICATION

This application claims the benefit of Republic of Korea Patent Application No. 10-2022-0127641, filed on Oct. 6, 2022, which is hereby incorporated by reference in its entirety.

BACKGROUND

Field of Technology

The present disclosure relates to a display device, and more particularly, to a display device which does not use a plastic substrate to improve a moisture permeation characteristic and reduce a crack on a side surface of the display device.

Description of the Related Art

As display devices which are used for a monitor of a computer, a television, a cellular phone, or the like, there are an organic light emitting display (OLED) device which is a self-emitting device, a liquid crystal display (LCD) device which requires a separate light source, and the like.

An applicable range of the display device is diversified to personal digital assistants as well as monitors of computers and televisions and a display device with a large display area and a reduced volume and weight is being studied.

Further, recently, a flexible display device which is manufactured by forming a display element and a wiring line on a flexible substrate such as plastic which is a flexible material so as to be capable of displaying images even though the display device is folded or rolled is getting attention as a next generation display device.

SUMMARY

An object to be achieved by the present disclosure is to provide a display device which uses a transparent conductive oxide layer as a substrate, instead of a plastic substrate.

Another object to be achieved by the present disclosure is to provide a display device which minimizes or reduces cracks generated on a side surface of a display device.

Still another object to be achieved by the present disclosure is to provide a display device in which placement of an inorganic insulating layer and a substrate having low rupture resistance at an outermost side of the display device is minimized or reduced.

Objects of the present disclosure are not limited to the above-mentioned objects, and other objects, which are not mentioned above, can be clearly understood by those skilled in the art from the following descriptions.

In order to achieve the above-described objects, according to an aspect of the present disclosure, a display device includes a substrate which includes an active area including a plurality of sub pixels and a non-active area enclosing the active area and is formed of transparent conductive oxide; an inorganic insulating layer disposed on the substrate; a protection pattern which is disposed so as to cover an end of the substrate and an end of the inorganic insulating layer; and an organic insulating layer which is disposed on the substrate, the inorganic insulating layer, and the protection pattern and extends to the outside of the substrate in a partial area.

In order to achieve the above-described objects, according to another aspect of the present disclosure, a display device includes a substrate which includes an active area including a plurality of sub pixels and a non-active area enclosing the active area and is formed of transparent conductive oxide; an inorganic insulating layer disposed on the substrate; a conductive pattern which is disposed so as to cover an end of the substrate and an end of the inorganic insulating layer and has one end disposed above the inorganic insulating layer; and an organic insulating layer which is disposed on the inorganic insulating layer and the conductive pattern and is disposed to extend from the active area to the non-active area, and extends to the outside of the substrate in a partial area.

According to the present disclosure, a transparent conductive oxide layer is used as a substrate of the display device to easily control a moisture permeability and improve a flexibility.

Other detailed matters of the exemplary embodiments are included in the detailed description and the drawings.

According to the present disclosure, a protection pattern which covers ends of a substrate and ends of an inorganic insulating layer which are formed of transparent conductive oxide is disposed to minimize or reduce cracks generated on the side surface of the display device.

According to the present disclosure, a protection pattern having a rupture resistance higher than that of the substrate and the inorganic insulating layer is disposed to improve the rupture resistance in an outer peripheral area.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
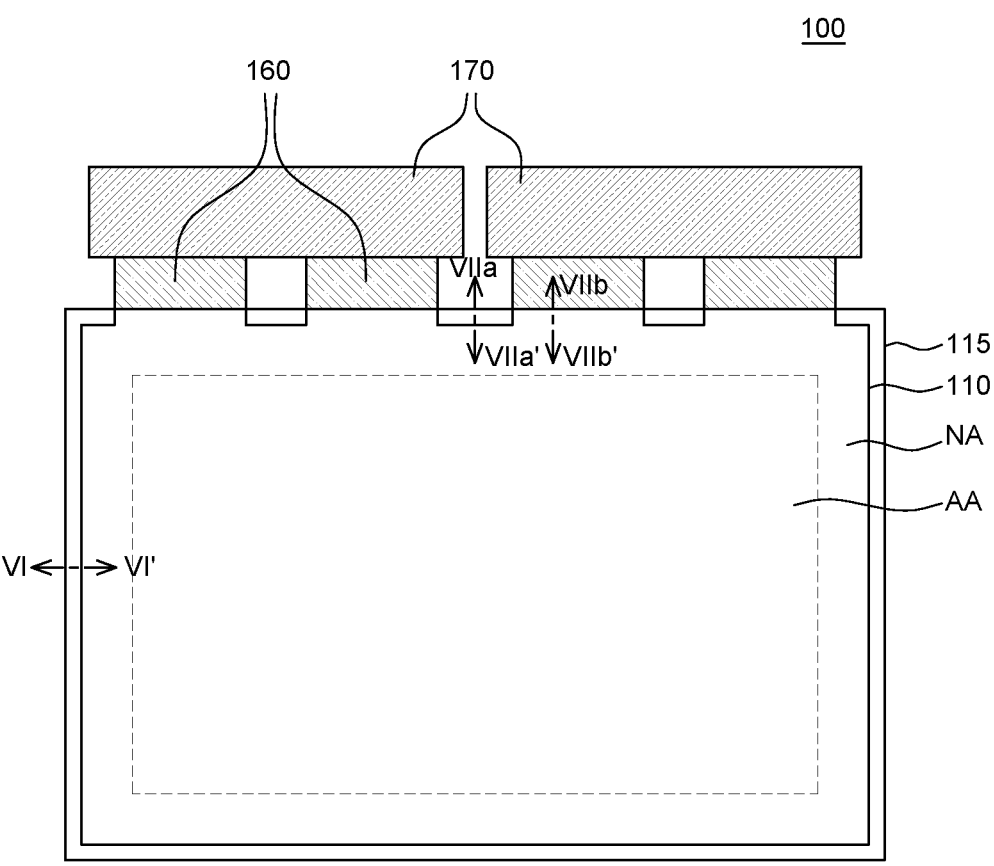
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as 'including', 'having', 'comprising of' used herein are generally intended to allow other components to be added unless the terms are used with the term 'only'. Any references to singular may include plural unless expressly stated otherwise.

Components are interpreted to include an ordinary error range even if not expressly stated.

When the position relation between two parts is described using the terms such as 'on', 'above', 'below', 'next', one or more parts may be positioned between the two parts unless the terms are used with the term 'immediately' or 'directly'.

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings.

Figure 2:
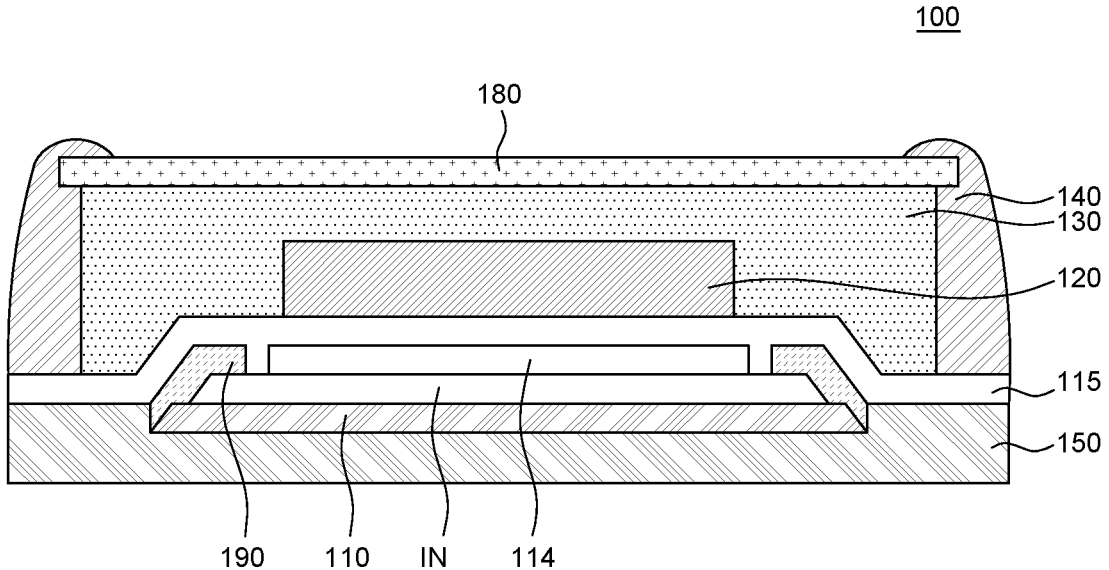
FIG. 2 is a schematic cross-sectional view of a display device according to an exemplary embodiment of the present disclosure.

FIG. 1 is a plan view of a display device according to an exemplary embodiment of the present disclosure. FIG. 2 is a schematic cross-sectional view of a display device according to an exemplary embodiment of the present disclosure. For the convenience of description, in FIG. 1, among various components of the display device 100, only a substrate 110, a bank 115, a plurality of flexible films 160, and a plurality of printed circuit boards 170 are illustrated.

Referring to FIGS. 1 and 2, the substrate 110 is a support member which supports other components of the display device 100. The substrate 110 may be formed of a transparent conductive oxide. For example, the substrate 110 may be formed of a transparent conductive oxide (TCO), such as indium tin oxide (ITO), indium zinc oxide (IZO), or indium tin zinc oxide (ITZO). However, a type of a material of the transparent conductive oxide is illustrative so that the substrate 110 may be formed by another transparent conductive oxide which has not been described in the specification, but is not limited thereto. At this time, the substrate 110 may be formed of a crystallized transparent conductive oxide which will be described in more detail below with reference to FIGS. 6A to 6C.

In the meantime, the substrate 110 may be formed by depositing the transparent conductive oxide with a very thin thickness. Therefore, as the substrate 110 is formed to have a very thin thickness, the substrate has a flexibility. A display device including a substrate 110 having a flexibility may be implemented as a flexible display device 100 which displays an image even in a folded or rolled state. For example, when the display device 100 is a foldable display device, the substrate 110 is folded or unfolded with respect to a folding axis. As another example, when the display device 100 is a rollable display device, the display device may be stored by being rolled around the roller. Accordingly, the display device 100 according to the exemplary embodiment of the present disclosure uses a substrate 110 having a flexibility to be implemented as a flexible display device 100 like a foldable display device or a rollable display device.

Further, the display device 100 according to the exemplary embodiment of the present disclosure uses a substrate 110 formed of a transparent conductive oxide to perform a laser lift off (LLO) process. The LLO process refers to a process of separating a temporary substrate TS below the substrate 110 from the substrate 110 using a laser during the manufacturing process of a display device 100. Accordingly, the substrate 110 is a layer for more easily performing the LLO process so that it is referred to as a functional thin film, a functional thin film layer, a functional substrate, or the like. The LLO process will be described in more detail below.

The substrate 110 includes an active area AA and a non-active area NA.

The active area AA is an area where images are displayed. In the active area AA, a pixel unit 120 configured by a plurality of sub pixels may be disposed to display images. For example, the pixel unit 120 is configured by a plurality of sub pixels including a light emitting diode and a driving circuit to display images.

The non-active area NA is an area where no image is displayed and various wiring lines, driving ICs, and the like for driving the sub pixels disposed in the active area AA are disposed. For example, in the non-active area NA, various driving ICs such as a gate driver IC and a data driver IC may be disposed.

The non-active area NA includes a gate driving area. The gate driving area is an area where a gate driver GD is disposed. The gate driver GD outputs a gate voltage, an emission control voltage, and the like in accordance with the control of the timing controller to select a sub pixel SP to which the data voltage is charged and control an emission timing. For example, the gate driving area in which the gate driver GD is formed may be a non-active area at a left side and a right side of the active area AA, but is not limited thereto. In this case, the gate driving area in which the gate driver GD is disposed may also be referred to as a gate-driver in panel (GIP) area.

The plurality of flexible films 160 are disposed at one end of the substrate 110. The plurality of flexible films 160 are electrically connected to one end of the substrate 110. The plurality of flexible films 160 are films in which various components are disposed on a base film having malleability to supply a signal to the plurality of sub pixels SP of the active area AA. One end of the plurality of flexible films 160 is disposed in the non-active area NA of the substrate 110 to supply a data voltage to the plurality of sub pixels SP of the active area AA. At this time, one end of the substrate 110 where the plurality of flexible films 160 is disposed may be an area different from the above-described gate driving area in which the gate driver GD is disposed. While it is illustrated that there are four flexible films 160 in FIG. 1, the number of flexible films 160 may vary depending on the design, but is not limited thereto.

In the meantime, a driving IC such as a gate driver IC or a data driver IC may be disposed on the plurality of flexible films 160. The driving IC is a component which processes data for displaying images and a driving signal for processing the data. The driving IC may be disposed by a chip on glass (COG), a chip on film (COF), or a tape carrier package (TCP) technique depending on a mounting method. In the present specification, for the convenience of description, it is described that the driving IC is mounted on the plurality of flexible films 160 by a chip on film manner, but is not limited thereto.

The printed circuit board 170 is connected to the plurality of flexible films 160. The printed circuit board 170 is a component which supplies signals to the driving IC. Various components may be disposed in the printed circuit board 170 to supply various driving signals such as a driving signal or a data voltage to the driving IC. In the meantime, even though two printed circuit boards 170 are illustrated in FIG. 1, the number of printed circuit boards 170 may vary depending on the design and is not limited thereto.

Referring to FIG. 2, an inorganic insulating layer IN is disposed on the substrate 110. The inorganic insulating layer IN may be a plurality of inorganic layers including a lower buffer layer 116, an upper buffer layer 111, a gate insulating layer 112, and a passivation layer 113 to be described below. The plurality of inorganic layers included in the inorganic insulating layer IN will be described in detail with reference to FIG. 5.

An over coating layer 114 is disposed on the inorganic insulating layer IN. Referring to FIG. 2, an end of the over coating layer 114 is disposed on a top surface of the inorganic insulating layer IN. The over coating layer 114 is an insulating layer which planarizes an upper portion of a driving circuit of a driving element, such as a thin film transistor or a storage capacitor to drive the plurality of sub pixels SP disposed on the inorganic insulating layer IN.

Therefore, the over coating layer 114 may also be referred to as a planarization layer. A specific placement relationship of the over coating layer 114 and the driving circuit will be described below in more detail with reference to FIG. 5.

The over coating layer 114 may be formed of an organic material, and for example, may be configured by a single layer or a double layer of polyimide or photo acryl, but is not limited thereto.

In the meantime, referring to FIG. 2, even though an end of the inorganic insulating layer IN is disposed inside more than the end of the substrate 110, the end of the inorganic insulating layer IN may be disposed on the same plane as the end of the substrate 110, but it is not limited thereto. Further, an end of the inorganic insulating layer IN may be an inclined surface, but may be perpendicular to a top surface and a bottom surface of the inorganic insulating layer IN, but is not limited thereto.

Referring to FIG. 2, the protection pattern 190 is disposed on the substrate 110 and the inorganic insulating layer IN so as to cover the end of the substrate 110 and the end of the inorganic insulating layer IN. Specifically, the protection pattern 190 is disposed so as to cover a side surface of the substrate 110, a side surface of the inorganic insulating layer IN, and a part of the top surface of the inorganic insulating layer IN extending from the side surface of the inorganic insulating layer IN. One end of the protection pattern 190 is disposed on the same straight line as the end of the substrate 110. The other end of the protection pattern 190 and the end of the over coating layer 114 are spaced apart from each other.

The protection pattern 190 may be formed of a transparent conductive oxide. For example, the protection pattern 190 may be formed of a transparent conductive oxide (TCO), such as indium tin oxide (ITO), indium zinc oxide (IZO), or indium tin zinc oxide (ITZO). Therefore, the protection pattern 190 may be referred to as a conductive pattern, but is not limited thereto. At this time, the protection pattern 190 may be formed of the same material as an anode of the light emitting diode disposed in each of the plurality of sub pixels and may be simultaneously formed with the anode by the same process, but is not limited thereto.

In the meantime, specifically, the protection pattern 190 may be formed of an amorphous transparent conductive oxide which will be described in more detail below with reference to FIGS. 6A to 6C.

Referring to FIGS. 1 and 2, the bank 115 is disposed on the substrate 110, the over coating layer 114, and the protection pattern 190 and extends to an outside of the substrate 110 in a partial area. The bank 115 extends from the active area AA to the non-active area NA and is disposed at an outermost side of the display device in a partial area. The bank 115 disposed in the active area AA is disposed at the boundary between the sub pixels SP which are adjacent to each other to reduce the color mixture of light emitted from the light emitting diode OLED of each of the plurality of sub pixels SP.

The bank 115 may be an organic insulating layer formed of an organic material. For example, the bank 115 may be formed of polyimide, acryl, or benzocyclobutene (BCB) resin, but it is not limited thereto.

A pixel unit 120 is disposed on the bank 115. Even though in FIG. 2, it is illustrated that the bank 115 is disposed in the entire area below the pixel unit 120 for the sake of convenience, the bank 115 is not disposed in a partial area of the pixel unit 120, that is, a portion overlapping the emission area of the plurality of sub pixels SP. In the portion overlapping the emission area of the plurality of sub pixels SP, the pixel unit 120 may be disposed on the over coating layer 114. The placement relationship of specific components of the pixel unit 120 and the bank 115 will be described below in more detail with reference to FIG. 5.

The pixel unit 120 may be disposed so as to correspond to the active area AA. The pixel unit 120 is a component which includes a plurality of sub pixels SP to display images. The plurality of sub pixels of the pixel unit 120 is minimum units which configure the active area AA and a light emitting diode and a driving circuit may be disposed in each of the plurality of sub pixels SP. For example, the light emitting diode of each of the plurality of sub pixels SP may include an organic light emitting diode including an anode, an organic emission layer, and a cathode or an LED including an N-type and a P-type semiconductor layers and an emission layer, but is not limited thereto. The driving circuit for driving the plurality of sub pixels SP may include a driving element such as a thin film transistor or a storage capacitor, but is not limited thereto. Hereinafter, for the convenience of description, it is assumed that the light emitting diode of each of the plurality of sub pixels SP is an organic light emitting diode, but it is not limited thereto.

In the meantime, the display device 100 may be configured by a top emission type or a bottom emission type, depending on an emission direction of light which is emitted from the light emitting diode.

According to the top emission type, light emitted from the light emitting diode is emitted to an upper portion of the substrate 110 on which the light emitting diode is disposed. In the case of the top emission type, a reflective layer may be formed below the anode to allow the light emitted from the light emitting diode to travel to the upper portion of the substrate 110, that is, toward the cathode.

According to the bottom emission type, light emitted from the light emitting diode is emitted to a lower portion of the substrate 110 on which the light emitting diode is disposed. In the case of the bottom emission type, the anode may be formed of a transparent conductive material and the cathode may be formed of the metal material having a high reflectance to allow the light emitted from the light emitting diode to travel to the lower portion of the substrate 110.

Hereinafter, for the convenience of description, the description will be made by assuming that the display device 100 according to an exemplary embodiment of the present disclosure is a bottom emission type display device, but it is not limited thereto.

An encapsulation layer 130 is disposed to cover the pixel unit 120. The encapsulation layer 130 seals the pixel unit 120 to protect the light emitting diode of the pixel unit 120 from moisture, oxygen, and impacts of the outside. The encapsulation unit 130 may be configured by thin film encapsulation (TFE) formed by alternately laminating a plurality of inorganic layers and a plurality of organic layers. For example, the inorganic layer may be formed of an inorganic material such as silicon nitride (SiNx), silicon oxide (SiOx), and aluminum oxide (AlOx) and the organic layer may be formed of epoxy or acrylic polymer, but they are not limited thereto. Further, the encapsulation layer 130 may be configured by a face seal type. For example, the encapsulation layer 130 may be formed by forming ultra-violet or thermosetting sealant on the entire surface of the pixel unit 120. However, the structure of the encapsulation layer 130 may be formed by various methods and materials, but is not limited thereto.

The encapsulation substrate 180 is disposed on the encapsulation layer 130. The encapsulation substrate 180 has a high modulus and may be formed of a metal material having a high corrosion resistance. For example, the encapsulation substrate 180 may be formed of a material having a high modulus of approximately 200 to 900 MPa. The encapsulation substrate may be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the encapsulation substrate 180 is formed of a metal material, the encapsulation substrate 180 may be implemented as an ultra-thin film and provide a strong resistance against external impacts and scratches.

A seal member 140 is disposed on the bank 115 extending to the outside of the substrate 110 so as to enclose side surfaces of the pixel unit 120 and the encapsulation layer 130. The seal member 140 is disposed in the non-active area NA and is disposed to enclose the pixel unit 120 disposed in the active area AA. The seal member 140 is disposed so as to enclose a side surface of the pixel unit 120 and a side surface of the encapsulation layer 130 to minimize the moisture permeation to the pixel unit 120. For example, the seal member 140 may be disposed so as to cover a top surface of the bank 115 which outwardly protrudes from the substrate 110, a side surface of the encapsulation layer 130 disposed so as to enclose the pixel unit 120, and a part of an end of the encapsulation substrate 180.

The seal member 140 may be formed of a non-conductive material having an elasticity so as to encapsulate the side surface of the pixel unit 120 and reinforce the rigidity of the side surface of the display device 100. Further, the seal member 140 may be formed of a material having an adhesiveness. The seal member 140 may further include an absorbent which absorbs moisture and oxygen from the outside to minimize the moisture permeation through the side portion of the display device 100. For example, the seal member 140 may be formed of polyimide (PI), polyurethane, epoxy, or acryl-based material, but is not limited thereto.

A polarizer 150 is disposed below the substrate 110 and the bank 115. The polarizer 150 selectively transmits light to reduce the reflection of external light which is incident onto the substrate 110. Specifically, in the display device 100, various metal materials which are applied to semiconductor devices, wiring lines, light emitting diodes, and the like are formed on the substrate 110. Therefore, the external light incident onto the substrate 110 may be reflected from the metal material so that the visibility of the display device 100 may be reduced due to the reflection of the external light. At this time, the polarizer 150 which suppresses the reflection of external light is disposed below the substrate 110 to increase outdoor visibility of the display device 100. However, the polarizer 150 may be omitted depending on an implementation example of the display device 100.

Even though not illustrated in the drawing, a barrier film may be disposed below the substrate 110 together with the polarizer 150. The barrier film minimizes the permeation of the moisture and oxygen outside the substrate 110 into the substrate 110 to protect the pixel unit 120 including a light emitting diode. However, the barrier film may be omitted depending on an implementation example of the display device 100, but it is not limited thereto.

Hereinafter, the plurality of sub pixels of the pixel unit 120 will be described in more detail with reference to FIGS. 3 to 5.

Figure 3:
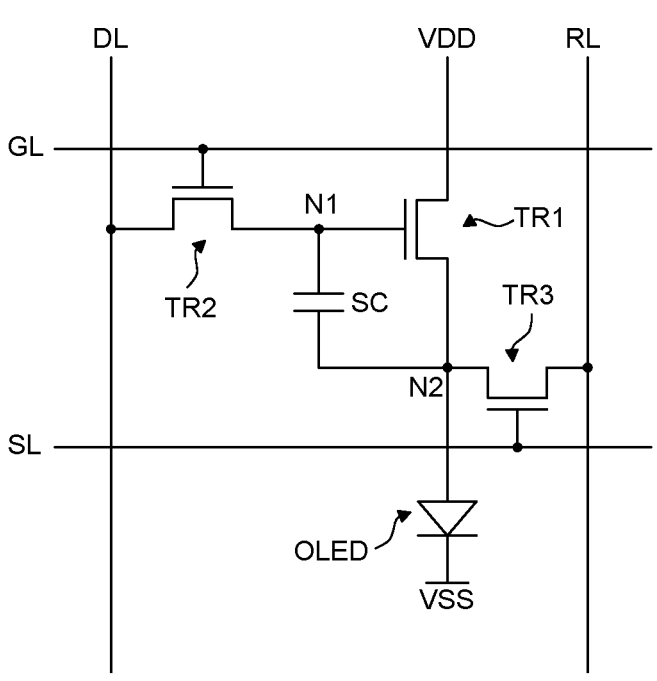
FIG. 3 is a circuit diagram of a sub pixel of a display device according to an exemplary embodiment of the present disclosure.

FIG. 3 is a circuit diagram of a sub pixel of a display device according to an exemplary embodiment of the present disclosure.

Referring to FIG. 3, the driving circuit for driving the light emitting diode OLED of the plurality of sub pixels SP includes a first transistor TR1, a second transistor TR2, a third transistor TR3, and a storage capacitor SC. In order to drive the driving circuit, a plurality of wiring lines including a gate line GL, a data line DL, a high potential power line VDD, a sensing line SL, and a reference line RL is disposed on the substrate 110.

Each of the first transistor TR1, the second transistor TR2, and the third transistor TR3 included in the driving circuit of one sub pixel SP includes a gate electrode, a source electrode, and a drain electrode.

The first transistor TR1, the second transistor TR2, and the third transistor TR3 may be P-type thin film transistors or N-type thin film transistors. For example, since in the P-type thin film transistor, holes flow from the source electrode to the drain electrode, the current may flow from the source electrode to the drain electrode. Since in the N-type thin film transistor, electrons flow from the source electrode to the drain electrode, the current may flow from the drain electrode to the source electrode. Hereinafter, the description will be made under the assumption that the first transistor TR1, the second transistor TR2, and the third transistor TR3 are N-type thin film transistors in which the current flows from the drain electrode to the source electrode, but the present disclosure is not limited thereto.

The first transistor TR1 includes a first active layer, a first gate electrode, a first source electrode, and a first drain electrode. The first gate electrode is connected to a first node N1, the first source electrode is connected to the anode of the light emitting diode OLED, and the first drain electrode is connected to the high potential power line VDD. When a voltage of the first node N1 is higher than a threshold voltage, the first transistor TR1 may be turned on and when the voltage of the first node N1 is lower than the threshold voltage, the first transistor TR1 may be turned off. When the first transistor TR1 is turned on, a driving current may be transmitted to the light emitting diode OLED by means of the first transistor TR1. Therefore, the first transistor TR1 which controls the driving current transmitted to the light emitting diode OLED may be referred to as a driving transistor.

The second transistor TR2 includes a second active layer, a second gate electrode, a second source electrode, and a second drain electrode. The second gate electrode is connected to the gate line GL, the second source electrode is connected to the first node N1, and the second drain electrode is connected to the data line DL. The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

The third transistor TR3 includes a third active layer, a third gate electrode, a third source electrode, and a third drain electrode. The third gate electrode is connected to the sensing line SL, the third source electrode is connected to the second node N2, and the third drain electrode is connected to the reference line RL. The third transistor TR3 may be turned on or off based on a sensing voltage from the sensing line SL. When the third transistor TR3 is turned on, a reference voltage from the reference line RL may be transmitted to the second node N2 and the storage capacitor SC. Therefore, the third transistor TR3 may also be referred to as a sensing transistor.

In the meantime, even though in FIG. 3, it is illustrated that the gate line GL and the sensing line SL are separate wiring lines, the gate line GL and the sensing line SL may be implemented as one wiring line, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting diode OLED emits light, so that a constant driving current may be supplied to the light emitting diode OLED. The storage capacitor SC includes a plurality of capacitor electrodes and for example, one of a plurality of capacitor electrodes may be connected to the first node N1 and the other one may be connected to the second node N2.

The light emitting diode OLED includes an anode, an emission layer, and a cathode. The anode of the light emitting diode OLED is connected to the second node N2 and the cathode is connected to the low potential power line VSS. The light emitting diode OLED is supplied with a driving current from the first transistor TR1 to emit light.

In the meantime, in FIG. 3, it is described that the driving circuit of the sub pixel SP of the display device 100 according to the exemplary embodiment of the present disclosure has a 3T1C structure including three transistors and one storage capacitor SC. However, the number and a connection relationship of the transistors and the storage capacitor may vary in various ways depending on the design and are not limited thereto.

Figure 4:
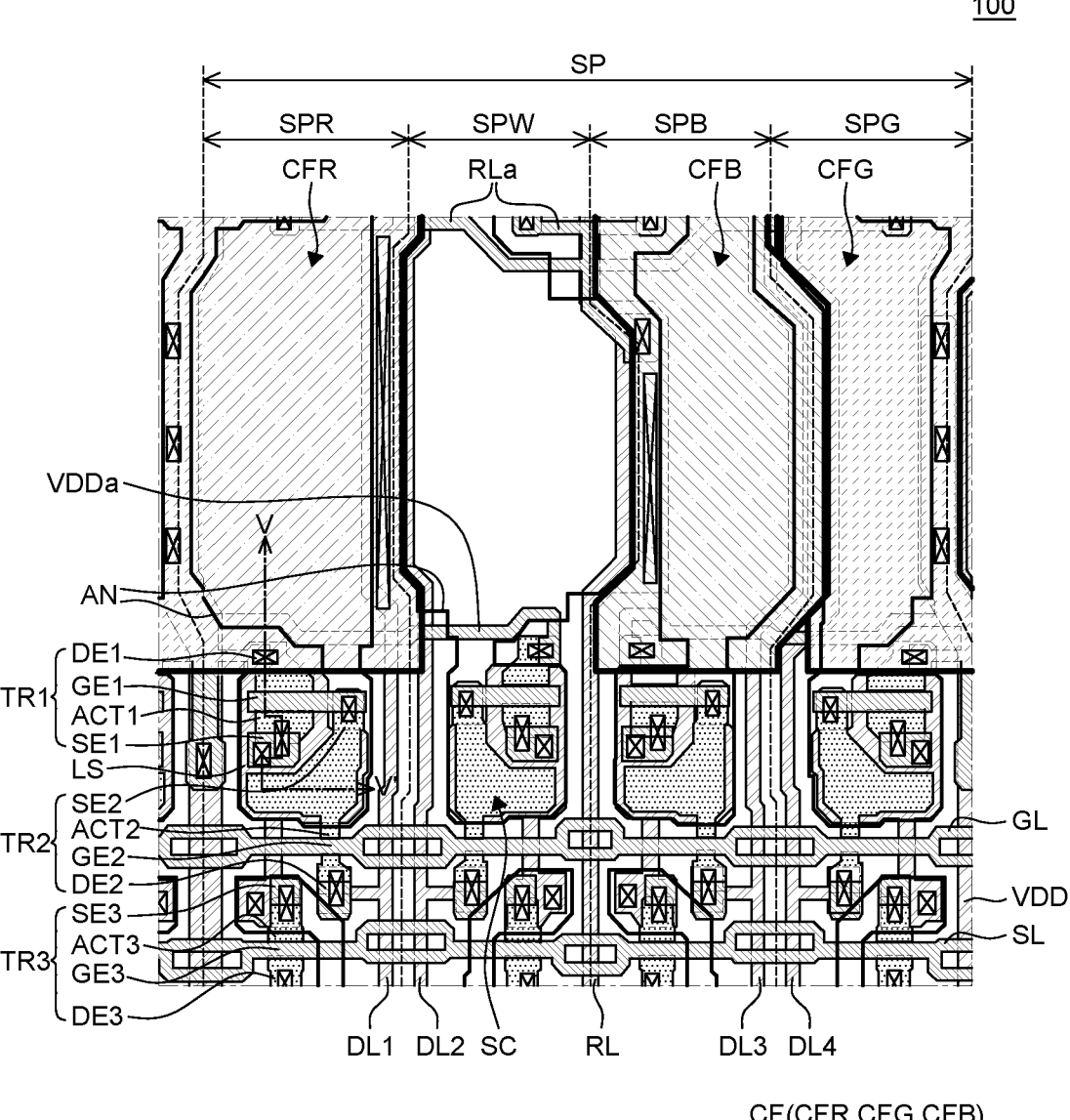
FIG. 4 is an enlarged plan view of a display device according to an exemplary embodiment of the present disclosure.

FIG. 4 is an enlarged plan view of a display device according to an exemplary embodiment of the present disclosure. FIG. 5 is a cross-sectional view taken along the line V-V' of FIG. 4. FIG. 4 is an enlarged plan view of a red sub pixel SPR, a white sub pixel SPW, a blue sub pixel SPB, and a green sub pixel SPG which configure one pixel. In FIG. 4, for the convenience of description, the bank 115 is omitted and edges of the plurality of color filters CF are illustrated with a bold solid line. Referring to FIGS. 4 and 5, the display device 100 according to the exemplary embodiment of the present disclosure includes a substrate 110, a lower buffer layer 116, an upper buffer layer 111, a gate insulating layer 112, a passivation layer 113, a planarization layer 114, a bank 115, a first transistor TR1, a second transistor TR2, a third transistor TR3, a storage capacitor SC, a light emitting diode OLED, a gate line GL, a sensing line SL, a data line DL, a reference line RL, a high potential power line VDD, and a plurality of color filters CF.

Referring to FIG. 4, the plurality of sub pixels SP includes a red sub pixel SPR, a green sub pixel SPG, a blue sub pixel SPB, and a white sub pixel SPW. For example, the red sub pixel SPR, the white sub pixel SPW, the blue sub pixel SPB, and the green sub pixel SPG may be sequentially disposed along a row direction. However, the placement order of the plurality of sub pixels SP is not limited thereto.

Each of the plurality of sub pixels SP includes an emission area and a circuit area. The emission area is an area where one color light is independently emitted and the light emitting diode OLED may be disposed therein. Specifically, in an area where the plurality of color filters CF and the anode AN overlap, an area which is exposed from the bank 115 to allow light emitted from the light emitting diode OLED to travel to the outside may be defined as an emission area. For example, referring to FIGS. 4 and 5 together, an emission area of the red sub pixel SPR may be an area exposed from the bank 115 in an area in which the red color filter CFR and the anode AN overlap. An emission area of the green sub pixel SPG may be an area exposed from the bank 115 in an area in which the green color filter CFG and the anode AN overlap. An emission area of the blue sub pixel SPB may be an area exposed from the bank 115 in an area in which the blue color filter CFB and the anode AN overlap. At this time, in an emission area of the white sub pixel SPW in which a separate color filter CF is not disposed, an area overlapping a part of the anode AN exposed from the bank 115 may be a white emission area which emits white light.

The circuit area is an area excluding the emission area and a driving circuit DP for driving the plurality of light emitting diodes OLED and a plurality of wiring lines which transmits various signals to the driving circuit DP may be disposed. The circuit area in which the driving circuit DP, the plurality of wiring lines, and the bank 115 are disposed may be a non-emission area. For example, in the circuit area, the driving circuit DP including the first transistor TR1, the second transistor TR2, the third transistor TR3, and the storage capacitor SC, a plurality of high potential power lines VDD, a plurality of data lines DL, a plurality of reference lines RL, a plurality of gate lines GL, a sensing line SL, the bank 115, and the like may be disposed.

Figure 5:
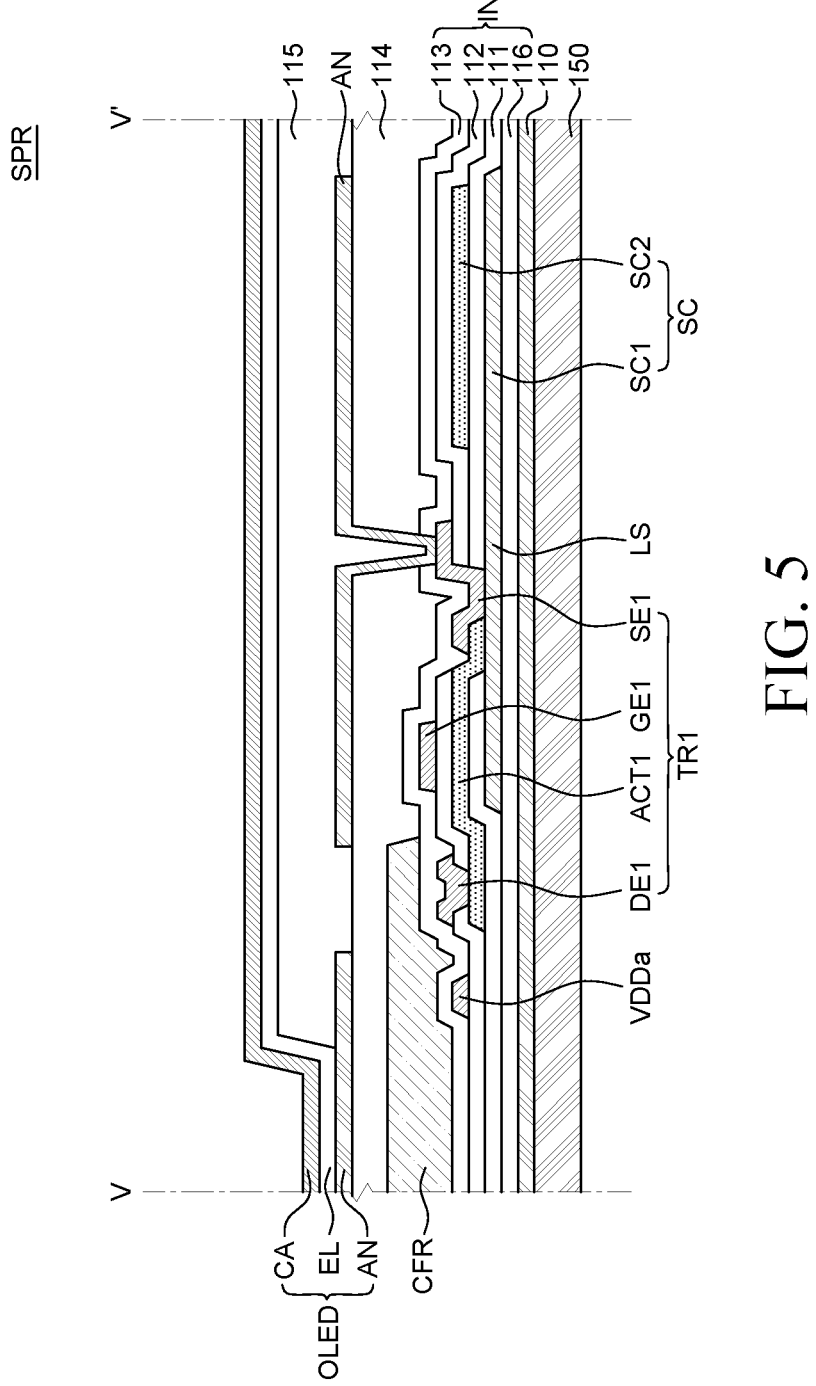
FIG. 5 is a cross-sectional view taken along the line V-V of FIG. 4, according to an embodiment of the present disclosure.

Referring to FIGS. 3 to 5 together, the lower buffer layer 116 is disposed on a substrate 110. The lower buffer layer 116 may suppress moisture and/or oxygen which penetrates from the outside of the substrate 110 from being spread. The moisture permeation characteristic of the display device 100 may be controlled by controlling a thickness or a lamination structure of the lower buffer layer 116. Further, the lower buffer layer 116 may suppress a short defect from being caused when the substrate 110 formed of a transparent conductive oxide is in contact with the other configurations such as the pixel unit 120. The lower buffer layer 116 may be formed of an inorganic material, for example, may be configured by a single layer or a double layer of silicon oxide SiOx and silicon nitride SiNx, but is not limited thereto.

The plurality of high potential power lines VDD, the plurality of data lines DL, the plurality of reference lines RL, and the light shielding layer LS are disposed on the lower buffer layer 116.

The plurality of high potential power lines VDD, the plurality of data lines DL, the plurality of reference lines RL, and the light shielding layer LS are disposed on the same layer of the substrate 110 and formed of the same conductive material. For example, the plurality of high potential power lines VDD, the plurality of data lines DL, the plurality of reference lines RL, and the light shielding layer LS may be configured by a conductive material such as copper (Cu), aluminum (Al), molybdenum (Mo), nickel (Ni), titanium (Ti), chrome (Cr), or an alloy thereof, but are not limited thereto.

The plurality of high potential power lines VDD are wiring lines which transmit the high potential power voltage to each of the plurality of sub pixels SP. The plurality of high potential power lines VDD may extend between the plurality of sub pixels SP in a column direction and two sub pixels SP which are adjacent to each other in the row direction may share one high potential power line VDD among the plurality of high potential power lines VDD. For example, one high potential power line VDD is disposed at a left side of the red sub pixel SPR to supply a high potential power voltage to the first transistor TR1 of each of the red sub pixel SPR and the white sub pixel SPW. The other high potential power line VDD is disposed at a right side of the green sub pixel SPG to supply a high potential power voltage to the first transistor TR1 of each of the blue sub pixel SPB and the green sub pixel SPG.

The plurality of data lines DL are lines which extend between the plurality of sub pixels SP in a column direction to transmit a data voltage to each of the plurality of sub pixels SP and includes a first data line DL1, a second data line DL2, a third data line DL3, and a fourth data line DL4. The first data line DL1 is disposed between the red sub pixel SPR and the white sub pixel SPW to transmit a data voltage to the second transistor TR2 of the red sub pixel SPR. The second data line DL2 is disposed between the first data line DL1 and the white sub pixel SPW to transmit the data voltage to the second transistor TR2 of the white sub pixel SPW. The third data line DL3 is disposed between the blue sub pixel SPB and the green sub pixel SPG to transmit a data voltage to the second transistor TR2 of the blue sub pixel SPB. The fourth data line DL4 is disposed between the third data line DL3 and the green sub pixel SPG to transmit the data voltage to the second transistor TR2 of the green sub pixel SPG.

The plurality of reference lines RL extends between the plurality of sub pixels SP in the column direction to transmit a reference voltage to each of the plurality of sub pixels SP. The plurality of sub pixels SP which forms one pixel may share one reference line RL. For example, one reference line RL is disposed between the white sub pixel SPW and the blue sub pixel SPB to transmit a reference voltage to a third transistor TR3 of each of the red sub pixel SPR, the white sub pixel SPW, the blue sub pixel SPB, and the green sub pixel SPG.

Referring to FIGS. 4 and 5 together, a light shielding layer LS is disposed on the lower buffer layer 116. The light shielding layer LS is disposed so as to overlap the first active layer ACT1 of at least the first transistor TR1 among the plurality of transistors TR1, TR2, and TR3 to block light incident onto the first active layer ACT1. If light is irradiated onto the first active layer ACT1, a leakage current is generated so that the reliability of the first transistor TR1 which is a driving transistor may be degraded. At this time, if the light shielding layer LS configured by an opaque conductive material, such as copper (Cu), aluminum (Al), molybdenum (Mo), nickel (Ni), titanium (Ti), chrome (Cr), or an alloy thereof, is disposed so as to overlap the first active layer ACT1, light incident from the lower portion of the substrate 110 onto the first active layer ACT1 may be blocked. Accordingly, the reliability of the first transistor TR1 may be improved. However, it is not limited thereto and the light shielding layer LS may be disposed so as to overlap the second active layer ACT2 of the second transistor TR2 and the third active layer ACTS of the third transistor TR3.

In the meantime, even though in the drawing, it is illustrated that the light shielding layer LS is a single layer, the light shielding layer LS may be formed as a plurality of layers. For example, the light shielding layer LS may be formed of a plurality of layers disposed so as to overlap each other with at least one of the lower buffer layer 118, the upper buffer layer 111, the gate insulating layer 112, and the passivation layer 113 therebetween.

The upper buffer layer 111 is disposed on the plurality of high potential power lines VDD, the plurality of data lines DL, the plurality of reference lines RL, and the light shielding layer LS. The upper buffer layer 111 may reduce permeation of moisture or impurities through the substrate 110. For example, the upper buffer layer 111 may be configured by a single layer or a double layer of silicon oxide SiOx or silicon nitride SiNx, but is not limited thereto.

Further, the upper buffer layer 111 may be omitted depending on a type of substrate 110 or a type of transistor, but is not limited thereto.

In each of the plurality of sub pixels SP, the first transistor TR1, the second transistor TR2, the third transistor TR3, and the storage capacitor SC are disposed on the upper buffer layer 111.

First, the first transistor TR1 includes a first active layer ACT1, a first gate electrode GE1, a first source electrode SE1, and a first drain electrode DE1.

The first active layer ACT1 is disposed on the upper buffer layer 111. The first active layer ACT1 may be formed of a semiconductor material such as an oxide semiconductor, amorphous silicon, or polysilicon, but is not limited thereto. For example, when the first active layer ACT1 is formed of an oxide semiconductor, the first active layer ACT1 is formed by a channel region, a source region, and a drain region and the source region and the drain region may be conductive regions, but are not limited thereto.

The gate insulating layer 112 is disposed on the first active layer ACT1. The gate insulating layer 112 is a layer for electrically insulating the first gate electrode GE1 from the first active layer ACT1 and may be formed of an insulating material. For example, the gate insulating layer 112 may be configured by a single layer or a double layer of silicon oxide SiOx or silicon nitride SiNx, but is not limited thereto.

The first gate electrode GE1 is disposed on the gate insulating layer 112 so as to overlap the first active layer ACT1. The first gate electrode GE1 may be configured by a conductive material, such as copper (Cu), aluminum (Al), molybdenum (Mo), nickel (Ni), titanium (Ti), chrome (Cr), or an alloy thereof, but is not limited thereto.

A first source electrode SE1 and a first drain electrode DE1 which are spaced apart from each other are disposed on the gate insulating layer 112. The first source electrode SE1 and the first drain electrode DE1 may be electrically connected to the first active layer ACT1 through a contact hole formed on the gate insulating layer 112. The first source electrode SE1 and the first drain electrode DE1 may be disposed on the same layer as the first gate electrode GE1 to be formed of the same conductive material, but is not limited thereto. For example, the first source electrode SE1 and the first drain electrode DE1 may be configured by copper (Cu), aluminum (Al), molybdenum (Mo), nickel (Ni), titanium (Ti), chrome (Cr), or an alloy thereof, but is not limited thereto.

The first drain electrode DE1 is electrically connected to the high potential power lines VDD. For example, the first drain electrodes DE1 of the red sub pixel SPR and the white sub pixel SPW may be electrically connected to the high potential power line VDD at the left side of the red sub pixel SPR. The first drain electrodes DE1 of the blue sub pixel SPB and the green sub pixel SPG may be electrically connected to the high potential power line VDD at the right side of the green sub pixel SPG.

At this time, an auxiliary high potential power line VDDa may be further disposed to electrically connect the first drain electrode DE1 with the high potential power line VDD. One end of the auxiliary high potential power line VDDa may be electrically connected to the high potential power line VDD and the other end may be electrically connected to the first drain electrode DE1 of each of the plurality of sub pixels SP. For example, when the auxiliary high potential power line VDDa is formed of the same material on the same layer as the first drain electrode DE1, one end of the auxiliary high potential power line VDDa may be electrically connected to the high potential power line VDD through a contact hole formed in the gate insulating layer 112 and the upper buffer layer 111. The other end of the auxiliary high potential power line VDDa extends to the first drain electrode DE1 to be integrally formed with the first drain electrode DE1.

At this time, the first drain electrode DE1 of the red sub pixel SPR and the first drain electrode DE1 of the white sub pixel SPW which are electrically connected to the same high potential power lines VDD may be connected to the same auxiliary high potential power line VDDa. The first drain electrode DE1 of the blue sub pixel SPB and the first drain electrode DE1 of the green sub pixel SPG may also be connected to the same auxiliary high potential power line VDDa. However, the first drain electrode DE1 and the high potential power line VDD may be electrically connected by another method, but it is not limited thereto.

The first source electrode SE1 may be electrically connected to the light shielding layer LS through a contact hole formed on the gate insulating layer 112 and the upper buffer layer 111. Further, a part of the first active layer ACT1 connected to the first source electrode SE1 may be electrically connected to the light shielding layer LS through a contact hole formed on the upper buffer layer 111. If the light shielding layer LS is floated, a threshold voltage of the first transistor TR1 fluctuates to affect the driving of the display device 100. Accordingly, the light shielding layer LS is electrically connected to the first source electrode SE1 to apply a voltage to the light shielding layer LS and it does not affect the driving of the first transistor TR1. However, in the present specification, even though it has been described that both the first active layer ACT1 and the first source electrode SE1 are in contact with the light shielding layer LS, only any one of the first source electrode SE1 and the first active layer ACT1 may be in direct contact with the light shielding layer LS. However, it is not limited thereto.

In the meantime, even though in FIG. 5, it is illustrated that the gate insulating layer 112 is formed on the entire substrate 110, the gate insulating layer 112 may be patterned so as to overlap only the first gate electrode GE1, the first source electrode SE1, and the first drain electrode DE1, but is not limited thereto.

The second transistor TR2 includes a second active layer ACT2, a second gate electrode GE2, a second source electrode SE2, and a second drain electrode DE2.

The second active layer ACT2 is disposed on the upper buffer layer 111. The second active layer ACT2 may be formed of a semiconductor material such as an oxide semiconductor, amorphous silicon, or polysilicon, but is not limited thereto. For example, when the second active layer ACT2 is formed of an oxide semiconductor, the second active layer ACT2 may be formed by a channel region, a source region, and a drain region and the source region and the drain region may be conductive regions, but are not limited thereto.

The second source electrode SE2 is disposed on the upper buffer layer 111. The second source electrode SE2 may be integrally formed with the second active layer ACT2 to be electrically connected to each other. For example, the semiconductor material is formed on the upper buffer layer 111 and a part of the semiconductor material is conducted to form the second source electrode SE2. Therefore, a part of the semiconductor material which is not conducted may become a second active layer ACT2 and a conducted part serves as a second source electrode SE2. However, the second active layer ACT2 and the second source electrode SE2 may be separately formed, but are not limited thereto.

The second source electrode SE2 is electrically connected to the first gate electrode GE1 of the first transistor TR1. The first gate electrode GE1 may be electrically connected to the second source electrode SE2 through a contact hole formed on the gate insulating layer 112. Accordingly, the first transistor TR1 may be turned on or turned off by a signal from the second transistor TR2.

The gate insulating layer 112 is disposed on the second active layer ACT2 and the second source electrode SE2 and the second drain electrode DE2 and the second gate electrode GE2 are disposed on the gate insulating layer 112.

The second gate electrode GE2 is disposed on the gate insulating layer 112 so as to overlap the second active layer ACT2. The second gate electrode GE2 may be electrically connected to the gate line GL and the second transistor TR2 may be turned on or turned off based on the gate voltage transmitted to the second gate electrode GE2. The second gate electrode GE2 may be configured by a conductive material, such as copper (Cu), aluminum (Al), molybdenum (Mo), nickel (Ni), titanium (Ti), chrome (Cr), or an alloy thereof, but is not limited thereto.

In the meantime, the second gate electrode GE2 may extend from the gate line GL. That is, the second gate electrode GE2 may be integrally formed with the gate line GL and the second gate electrode GE2 and the gate line GL may be formed of the same conductive material. For example, the gate line GL may be configured by copper (Cu), aluminum (Al), molybdenum (Mo), nickel (Ni), titanium (Ti), chrome (Cr), or an alloy thereof, but is not limited thereto.

The gate line GL is a wiring line which transmits the gate voltage to each of the plurality of sub pixels SP and intersects the circuit area of the plurality of sub pixels SP to extend in the row direction. The gate line GL extends in the row direction to intersect the plurality of high potential power lines VDD, the plurality of data lines DL, and the plurality of reference lines RL extending in the column direction.

The second drain electrode DE2 is disposed on the gate insulating layer 112. The second drain electrode DE2 may be electrically connected to the second active layer ACT2 through a contact hole formed in the gate insulating layer 112 and may be electrically connected to one of the plurality of data lines DL through a contact hole formed in the gate insulating layer 112 and the upper buffer layer 111, simultaneously. For example, the second drain electrode DE2 of the red sub pixel SPR may be electrically connected to the first data line DL1 and the second drain electrode DE2 of the white sub pixel SPW may be electrically connected to the second data line DL2. For example, the second drain electrode DE2 of the blue sub pixel SPB may be electrically connected to the third data line DL3 and the second drain electrode DE2 of the green sub pixel SPG may be electrically connected to the fourth data line DL4. The second drain electrode DE2 may be configured by a conductive material, such as copper (Cu), aluminum (Al), molybdenum (Mo), nickel (Ni), titanium (Ti), chrome (Cr), or an alloy thereof, but is not limited thereto.

The third transistor TR3 includes a third active layer ACTS, a third gate electrode GE3, a third source electrode SE3, and a third drain electrode DE3.

The third active layer ACT3 is disposed on the upper buffer layer 111. The third active layer ACT3 may be formed of a semiconductor material, such as an oxide semiconductor, amorphous silicon, or polysilicon, but is not limited thereto. For example, when the third active layer ACT3 is formed of an oxide semiconductor, the third active layer ACT3 is formed by a channel region, a source region, and a drain region and the source region and the drain region may be conductive regions, but are not limited thereto.

The gate insulating layer 112 is disposed on the third active layer ACT3 and the third gate electrode GE3, the third source electrode SE3, and the third drain electrode DE3 are disposed on the gate insulating layer 112.

The third gate electrode GE3 is disposed on the gate insulating layer 112 so as to overlap the third active layer ACT3. The third gate electrode GE3 may be electrically connected to the sensing line SL and the third transistor TR3 may be turned on or turned off based on the sensing voltage transmitted to the third transistor TR3. The third gate electrode GE3 may be configured by a conductive material, such as copper (Cu), aluminum (Al), molybdenum (Mo), nickel (Ni), titanium (Ti), chrome (Cr), or an alloy thereof, but is not limited thereto.

In the meantime, the third gate electrode GE3 may extend from the sensing line SL. That is, the third gate electrode GE3 may be integrally formed with the sensing line SL and the third gate electrode GE3 and the sensing line SL may be formed of the same conductive material. For example, the sensing line SL may be configured by copper (Cu), aluminum (Al), molybdenum (Mo), nickel (Ni), titanium (Ti), chrome (Cr), or an alloy thereof, but is not limited thereto.

The sensing line SL transmits a sensing voltage to each of the plurality of sub pixels SP and extends between the plurality of sub pixels SP in a row direction. For example, the sensing line SL extends at a boundary between the plurality of sub pixels SP in the row direction to intersect the plurality of high potential power lines VDD, the plurality of data lines DL, and the plurality of reference lines RL extending in the column direction.

The third source electrode SE3 may be electrically connected to the third active layer ACT3 through a contact hole formed on the gate insulating layer 112. The third source electrode SE3 may be configured by a conductive material, such as copper (Cu), aluminum (Al), molybdenum (Mo), nickel (Ni), titanium (Ti), chrome (Cr), or an alloy thereof, but is not limited thereto.

Further, a part of the third active layer ACT3 which is in contact with the third source electrode SE3 may be electrically connected to the light shielding layer LS through a contact hole formed in the upper buffer layer 111. That is, the third source electrode SE3 may be electrically connected to the light shielding layer LS with the third active layer ACT3 therebetween. Therefore, the third source electrode SE3 and the first source electrode SE1 may be electrically connected to each other by means of the light shielding layer LS.

The third drain electrode DE3 may be electrically connected to the third active layer ACT3 through a contact hole formed on the gate insulating layer 112. The third drain electrode DE3 may be configured by a conductive material, such as copper (Cu), aluminum (Al), molybdenum (Mo), nickel (Ni), titanium (Ti), chrome (Cr), or an alloy thereof, but is not limited thereto.

The third drain electrode DE3 may be electrically connected to the reference line RL. For example, the third drain electrode DE3 of each of the red sub pixel SPR, the white sub pixel SPW, the blue sub pixel SPB, and the green sub pixel SPG which form one pixel may be electrically connected to the same reference line RL. That is, the plurality of sub pixels SP which forms one pixel may share one reference line RL.

At this time, an auxiliary reference line RLa may be disposed to transmit the reference line RL extending in the column direction to the plurality of sub pixels SP which are disposed in parallel along the row direction. The auxiliary reference line RLa extends in the row direction to electrically connect the reference line RL and the third drain electrode DE3 of each of the plurality of sub pixels SP. One end of the auxiliary reference line RLa may be electrically connected to the reference line RL through a contact hole formed in the upper buffer layer 111 and the gate insulating layer 112. The other end of the auxiliary reference line RLa may be electrically connected to the third drain electrode DE3 of each of the plurality of sub pixels SP. In this case, the auxiliary reference line RLa may be integrally formed with the third drain electrode DE3 of each of the plurality of sub pixels SP and a reference voltage from the reference line RL may be transmitted to the third drain electrode DE3 by means of the auxiliary reference line RLa. However, the auxiliary reference line RLa may be separately formed from the third drain electrode DE3, but is not limited thereto.

The storage capacitor SC is disposed in the circuit area of the plurality of sub pixels SP. The storage capacitor SC may store a voltage between the first gate electrode GE1 and the first source electrode SE1 of the first transistor TR1 to allow the light emitting diode OLED to continuously maintain a constant state for one frame. The storage capacitor SC may include a first storage capacitor electrode SC1 and a second storage capacitor electrode SC2.

In each of the plurality of sub pixels SP, the first storage capacitor electrode SC1 is disposed between the lower buffer layer 116 and the upper buffer layer 111. The first storage capacitor electrode SC1 may be disposed to be the closest to the substrate 110 among the conductive components disposed on the substrate 110. The first storage capacitor electrode SC1 may be integrally formed with the light shielding layer LS and may be electrically connected to the first source electrode SE1 by means of the light shielding layer LS.

The upper buffer layer 111 is disposed on the first storage capacitor electrode SC1 and the second storage capacitor electrode SC2 is disposed on the upper buffer layer 111. The second storage capacitor electrode SC2 may be disposed so as to overlap the first storage capacitor electrode SC1. The second storage capacitor electrode SC2 is integrally formed with the second source electrode SE2 to be electrically connected to the second source electrode SE2 and the first gate electrode GE1. For example, the semiconductor material is formed on the upper buffer layer 111 and a part of the semiconductor material is conducted to form the second source electrode SE2 and the second storage capacitor electrode SC2. Accordingly, a part of the semiconductor material which is not conducted may function as a second active layer ACT2 and the conducted part may function as a second source electrode SE2 and the second storage capacitor electrode SC2. As described above, the first gate electrode GE1 is electrically connected to the second source electrode SE2 through the contact hole formed in the gate insulating layer 112. Accordingly, the second storage capacitor electrode SC2 is integrally formed with the second source electrode SE2 to be electrically connected to the second source electrode SE2 and the first gate electrode GE1.

In summary, the first storage capacitor electrode SC1 of the storage capacitor SC is integrally formed with the light shielding layer LS to be electrically connected to the light shielding layer LS, the first source electrode SE1, and the third source electrode SE3. Accordingly, the second storage capacitor electrode SC2 is integrally formed with the second source electrode SE2 and the active layer ACT2 to be electrically connected to the second source electrode SE2 and the first gate electrode GE1. Accordingly, the first storage capacitor electrode SC1 and the second storage capacitor electrode SC2 which overlap with the upper buffer layer 111 therebetween may constantly maintain the voltage of the first gate electrode GE1 and the first source electrode SE1 of the first transistor TR1 to maintain the constant state of the light emitting diode OLED.

The passivation layer 113 is disposed on the first transistor TR1, the second transistor TR2, the third transistor TR3, and the storage capacitor SC. The passivation layer 113 is an insulating layer for protecting components below the passivation layer 113. For example, the passivation layer 113 may be configured by a single layer or a double layer of silicon oxide SiOx or silicon nitride SiNx, but is not limited thereto. Further, the passivation layer 113 may be omitted depending on the exemplary embodiment.

A plurality of color filters CF may be disposed in the emission area of each of the plurality of sub pixels SP on the passivation layer 113. As described above, the display device 100 according to the exemplary embodiment of the present disclosure is a bottom emission type in which light emitted from the light emitting diode OLED is directed to the lower portion of the light emitting diode OLED and the substrate 110. Therefore, the plurality of color filters CF may be disposed below the light emitting diode OLED. Light emitted from the light emitting diode OLED passes through the plurality of color filters CF and may be implemented as various colors of light.

The plurality of color filters CF may include a red color filter CFR, a blue color filter CFB, and a green color filter CFG. The red color filter CFR may be disposed in an emission area of a red sub pixel SPR of the plurality of sub pixels SP, the blue color filter CFB may be disposed in an emission area of the blue sub pixel SPB, and the green color filter CFG may be disposed in an emission area of the green sub pixel SPG.

The planarization layer 114 is disposed on the passivation layer 113 and the plurality of color filters CF. The planarization layer 114 is an insulating layer which planarizes an upper portion of the substrate 110 on which the first transistor TR1, the second transistor TR2, the third transistor TR3, the storage capacitor SC, the plurality of high potential power lines VDD, the plurality of data lines DL, the plurality of reference lines RL, the plurality of gate lines GL, and the plurality of sensing lines SL are disposed. The planarization layer 114 may be formed of an organic material, and for example, may be configured by a single layer or a double layer of polyimide or photo acryl, but is not limited thereto.

The light emitting diode OLED is disposed in an emission area of each of the plurality of sub pixels SP. The light emitting diode OLED is disposed on the planarization layer 114 in each of the plurality of sub pixels SP. The light emitting diode OLED includes an anode AN, an emission layer EL, and a cathode CA.

The anode AN is disposed on the planarization layer 114 in the emission area. The anode AN supplies holes to the emission layer EL so that the anode may be formed of a conductive material having a high work function. For example, the anode AN may be formed of a transparent conductive material such as indium tin oxide (ITO) and indium zinc oxide (IZO), but is not limited thereto.

In the meantime, the anode AN may extend toward the circuit area. A part of the anode AN may extend toward the first source electrode SE1 of the circuit area from the emission area and may be electrically connected to the first source electrode SE1 through a contact hole formed in the planarization layer 114 and the passivation layer 113. Accordingly, the anode AN of the light emitting diode OLED may extend to the circuit area to be electrically connected to the first source electrode SE1 of the first transistor TR1 and the second storage capacitor electrode SC2 of the storage capacitor SC.

In the emission area and the circuit area, the emission layer EL is disposed on the anode AN. The emission layer EL may be formed as one layer over the plurality of sub pixels SP. That is, the emission layers EL of the plurality of sub pixels SP are connected to each other to be integrally formed. The emission layer EL may be configured by one emission layer or may have a structure in which a plurality of emission layers which emit different color light are laminated. The emission layer EL may further include an organic layer, such as a hole injection layer, a hole transport layer, an electron transport layer, and an electron injection layer.

The cathode CA is disposed on the emission layer EL in the emission area and the circuit area. The cathode CA supplies electrons to the emission layer EL so that the cathode may be formed of a conductive material having a low work function. The cathode CA may be formed as one layer over the plurality of sub pixels SP. That is, the cathodes CA of the plurality of sub pixels SP are connected to each other to be integrally formed. For example, the cathode CA may be formed of a transparent conductive material such as indium tin oxide (ITO) and indium zinc oxide (IZO) or ytterbium (Yb) alloy and may further include a metal doping layer, but is not limited thereto. Even though it is not illustrated in FIGS. 4 and 5, the cathode CA of the light emitting diode OLED is electrically connected to the low potential power line VSS to be supplied with a low potential power voltage.

The bank 115 is disposed between the anode AN and the emission layer EL. The bank 115 is disposed to overlap the active area AA and cover the edge of the anode AN. The bank 115 is disposed at the boundary between the sub pixels SP which are adjacent to each other to reduce the color mixture of light emitted from the light emitting diode OLED of each of the plurality of sub pixels SP. The bank 115 may be formed of an insulating material such as, polyimide, acryl, or benzocyclobutene (BCB) resin, but it is not limited thereto.

Hereinafter, a manufacturing process of a display device according to an exemplary embodiment of the present disclosure will be described in detail with reference to FIGS. 6A to 6C.

Figure 6A:
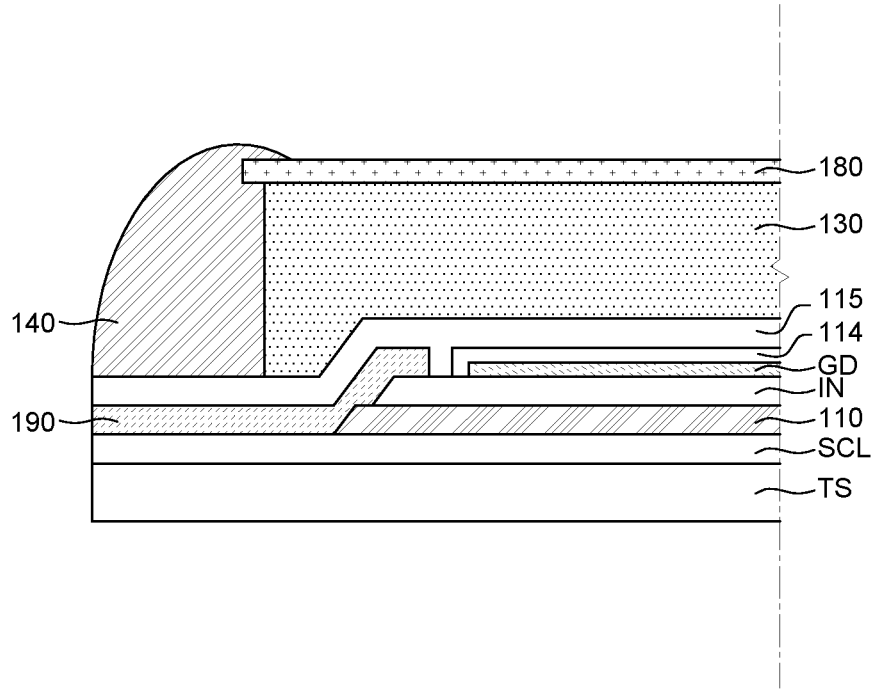
FIGS. 6A to 6C are cross-sectional views for explaining a manufacturing process of a display device according to an exemplary embodiment of the present disclosure.
Figure 6B:
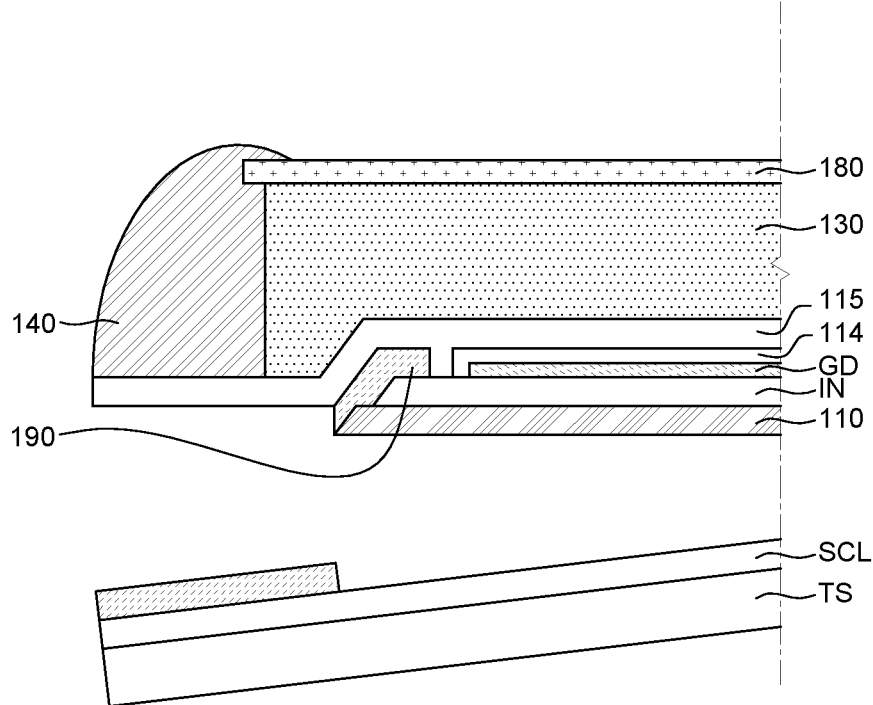
Figure 6C:
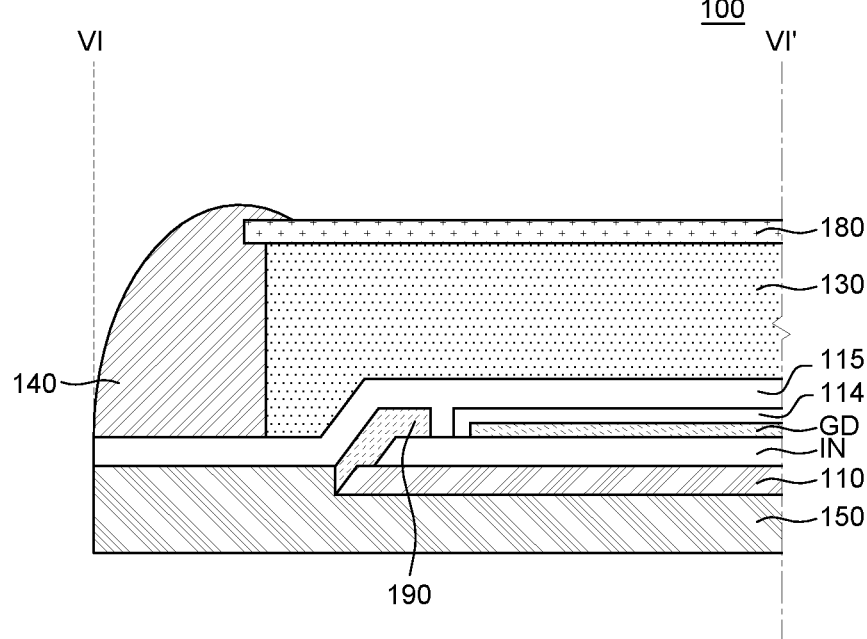

FIGS. 6A to 6C are views for explaining a manufacturing process of a display device according to an exemplary embodiment of the present disclosure. FIG. 6A is a cross-sectional view of a state before performing an LLO process, FIG. 6B is a cross-sectional view for an LLO process, and FIG. 6C is a cross-sectional view for a final state of a display device 100 after completing the LLO process. In FIGS. 6A to 6C, only the non-active area NA is illustrated for the convenience of description and the active area AA is not illustrated.

Referring to FIG. 6A, components disposed in the non-active area NA of the display device are formed on a temporary substrate TS and a sacrificial layer SCL.

First, the sacrificial layer SCL is formed on the temporary substrate ST. The temporary substrate TS may be formed of a material through which a laser, and the like can pass. For example, the sacrificial layer SCL may use a hydrogenated amorphous silicon or an amorphous silicon which is hydrogenated and doped with impurities. Therefore, after completing the manufacturing of the display device 100, if the laser is irradiated from the lower portion of the temporary substrate TS, hydrogen of the sacrificial layer SCL is dehydrogenated and the sacrificial layer SCL and the temporary substrate TS may be separated from the substrate 110.

The substrate 110 may be formed on the sacrificial layer SCL. The substrate 110 may be formed of a transparent conductive oxide and may be formed to have a very thin thickness by a deposition process, such as sputtering. At this time, the transparent conductive oxide which configures the substrate 110 may be amorphous transparent conductive oxide.

The inorganic insulating layer IN is formed on the substrate 110. The inorganic insulating layer IN may be formed of an inorganic material, and for example, may be configured by a single layer or a double layer of silicon oxide SiOx and silicon nitride SiNx, but is not limited thereto. The inorganic insulating layer IN, for example, may be formed by a chemical vapor deposition (CVD). At this time, the CVD process may be performed at a high temperature process of approximately 350° C.

The gate driver GD is formed on the inorganic insulating layer IN. Even though in FIG. 6A, it is illustrated that the gate driver GD is formed on the inorganic insulating layer IN, the components of the gate driver GD may be disposed between a plurality of inorganic layers of the inorganic insulating layer IN.

The over coating layer 114 is formed on the inorganic insulating layer IN and the gate driver GD.

At this time, during a process of forming the over coating layer 114, a heat treatment process of approximately 200° C. may be performed. Therefore, the over coating layer 114 which is formed of an organic material may be stably cured by the heat treatment process and the adhesiveness for bonding components disposed above and below the over coating layer 114 may also be increased.

In the meantime, the amorphous transparent conductive oxide which configures the substrate 110 may be crystallized by the above-described CVD process and heat treatment process. In general, the transparent conductive oxide may be crystallized at approximately 120° C. Therefore, the amorphous transparent conductive oxide which configures the initial substrate 110 is crystalized by the CVD process and the heat treatment process as described above so that the substrate 110 may be formed of the crystallized transparent conductive oxide.

The protection pattern 190 is formed on the substrate 110 and the inorganic insulating layer IN so as to cover the end of the substrate 110 and the end of the inorganic insulating layer IN. At this time, one end of the protection pattern 190 is disposed to the outside of the substrate 110, that is, to the outermost side of the sacrificial layer SCL on the sacrificial layer SCL and the other end of the protection pattern 190 is disposed to be spaced apart from the end of the over coating layer 114.

The protection pattern 190 may be formed of a transparent conductive oxide. For example, the protection pattern 190 may be formed of a transparent conductive oxide (TCO), such as indium tin oxide (ITO), indium zinc oxide (IZO), or indium tin zinc oxide (ITZO).

At this time, the protection pattern 190 may be formed of an amorphous transparent conductive oxide. Specifically, the protection pattern 190 may be formed after the CVD process and the heat treatment process which are high temperature processes as described above. Therefore, the transparent conductive oxide which forms the protection pattern 190 may be an amorphous state in which the crystallization does not occur. That is, the protection pattern 190 may be formed of an amorphous transparent conductive oxide.

In the meantime, for example, the protection pattern 190 may be simultaneously formed with a process of forming the anodes AN of the plurality of light emitting diodes OLED of the active area AA. As described above, the anode AN is formed of the transparent conductive oxide so that the protection pattern 190 formed of the same material as the anode AN may be formed by the same process as the anode AN, simultaneously. However, it is not limited thereto and when there is no process which is performed at a temperature of approximately 120° C. or higher after forming the protection pattern 190, the protection pattern 190 may be formed at an arbitrary time.

The bank 115 is formed on the protection pattern 190 and the over coating layer 114, the encapsulation layer 130 is formed on the bank 115, the encapsulation substrate 180 is formed on the encapsulation layer 130, a seal member 140 is formed on the bank 115 to enclose side surfaces of the encapsulation layer 130 and the encapsulation substrate 180.

Next, referring to FIG. 6B, the sacrificial layer SCL and the temporary substrate TS are separated from the substrate 110. The process of separating the sacrificial layer SCL and the temporary substrate TS from the substrate 110 may be performed by the LLO process. Therefore, if the laser is irradiated from the lower portion of the temporary substrate TS, hydrogen of the sacrificial layer SCL is dehydrogenated and the sacrificial layer SCL and the temporary substrate TS may be separated from the substrate 110.

Referring to FIG. 6B, a part of the protection pattern 190 disposed above the sacrificial layer SCL may be separated from the substrate 110 together with the sacrificial layer SCL during the LLO process. Therefore, a part of the lower portion of the bank 115 which is disposed to extend to the outermost side of the display device may be exposed. At this time, the end of the protection pattern 190 which is not separated from the substrate 110 may be disposed on the same straight line as the end of the substrate 110. That is, as illustrated in FIG. 6B, the end of the protection pattern 190 does not protrude outwardly from the end of the substrate 110, but may be disposed on the same straight line as the end of the substrate 110, but is not limited thereto.

Finally, referring to FIG. 6C, a polarizer 150 is disposed to cover a lower portion of the substrate 110 and a part of the lower portion of the bank 115 which are exposed by the LLO process.

Hereinafter, the non-active area NA of the display device will be described in detail with reference to FIGS. 7A and 7B.

Figure 7A:
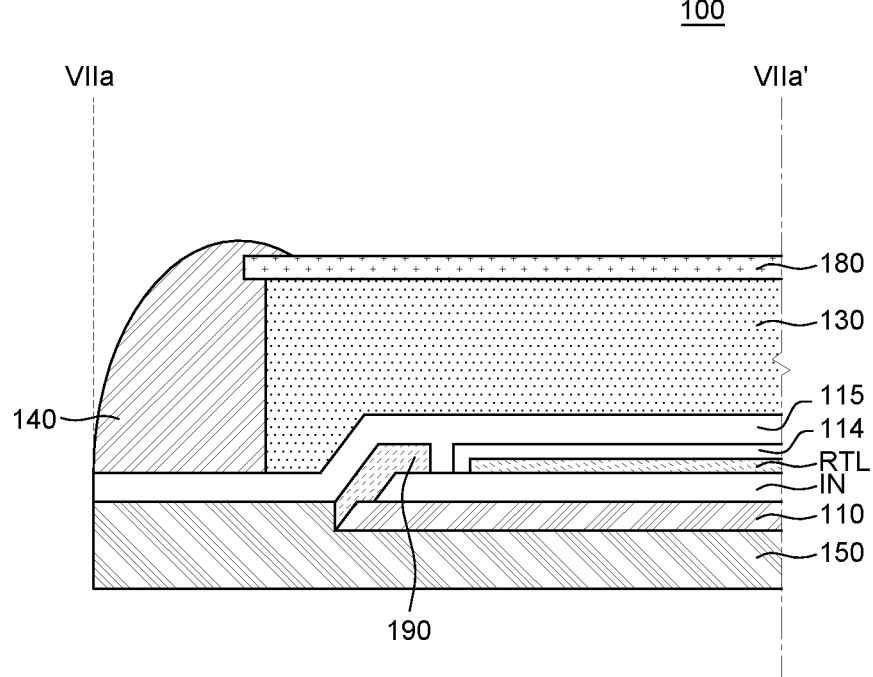
FIG. 7A is a cross-sectional view taken along the line VIIa-VIIa' of FIG. 1, according to an embodiment of the present disclosure.

FIG. 7A is a cross-sectional view taken along the line VIIa-VIIa' of FIG. 1. FIG. 7B is a cross-sectional view taken along the line VIIb-VIIb' of FIG. 1. At this time, FIG. 7A is a cross-sectional view of an area of the non-active area NA in which the plurality of flexible films 160 are not disposed and FIG. 7B is a cross-sectional view of an area of the non-active area NA in which the plurality of flexible films 160 are disposed.

Figure 7B:
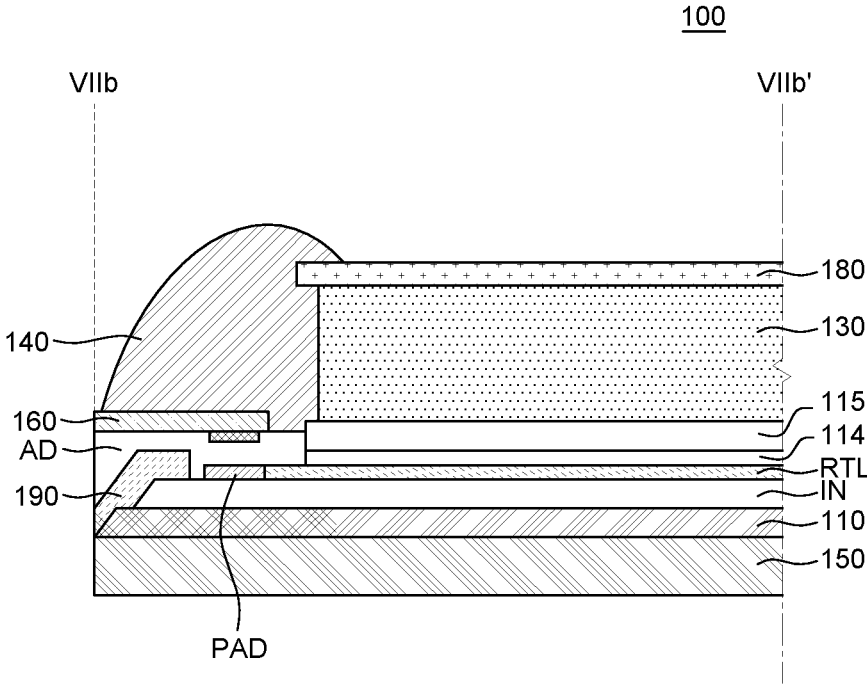
FIG. 7B is a cross-sectional view taken along VIIb-VIIb' of FIG. 1, according to an embodiment of the present disclosure.

Referring to FIGS. 7A and 7B, in the non-active area NA, a plurality of pads PAD and a plurality of routing lines RTL may be disposed on the substrate 110.

As described above with reference to FIG. 1, the plurality of pads PAD may be disposed at one end of the non-active area NA of the substrate 110 in which the plurality of flexible films 160 are disposed on the substrate 110 so as to correspond to the plurality of flexible films 160. Therefore, one end of the non-active area NA of the substrate 110 in which the plurality of flexible films 160 are disposed may be referred to as a pad area.

The plurality of routing lines RTL are connected to the plurality of signal lines of the active area AA and may extend to the non-active area NA. The plurality of routing lines RTL may be electrically connected to the plurality of signal lines and the plurality of pads PAD.

The plurality of flexible films 160 may be electrically connected to the plurality of pads PAD. For example, the plurality of flexible films 160 may be electrically connected to the plurality of pads PAD by means of the conductive adhesive layer AD. Referring to FIG. 7B, the conductive adhesive layer AD is disposed between the plurality of pads PAD and the plurality of flexible films 160. Accordingly, the conductive adhesive layer AD may electrically connect the plurality of pads PAD and the plurality of flexible films 160. The conductive adhesive layer AD may be a conductive adhesive layer in which conductive balls are dispersed in an insulating base member, but is not limited thereto.

In the meantime, referring to FIGS. 7A and 7B, in the display device according to the exemplary embodiment of the present disclosure, the bank 115 extends to the non-active area NA and outwardly extends from the substrate 110 in a partial area.

First, referring to FIG. 7A, the bank 115 extends outwardly from the substrate 110 in an area of the non-active area NA in which the plurality of flexible films 160 are not disposed to be disposed at the outermost side of the display device.

Next, referring to FIG. 7B, in the area of the non-active area NA in which the plurality of flexible films 160 are disposed, the end of the bank 115 may be disposed more inner than from the area in which the plurality of pads PAD are disposed. An end of the over coating layer 114 disposed below the bank 115 may be also disposed more inner than the area in which the plurality of pads PAD are disposed. Therefore, the plurality of pads PAD exposed from the bank 115 and the over coating layer 114 may be electrically connected to the plurality of flexible films 160 by the conductive adhesive layer AD.

In the meantime, referring to FIG. 7B, in an area in which the end of the bank 115 is disposed inside more than the area in which the plurality of pads PAD are disposed, the plurality of pads PAD may be disposed on the inorganic insulating layer IN disposed on the substrate 110. Therefore, in the area in which the end of the bank 115 is disposed inside more than the area in which the plurality of pads PAD are disposed, the substrate 110 and the inorganic insulating layer IN may be disposed more outer than the bank 115.

In the area in which the end of the bank 115 is disposed inside more than the area in which the plurality of pads PAD are disposed, the protection pattern 190 may be disposed on the side surface of the substrate 110, the side surface of the inorganic insulating layer IN, and a part of the top surface of the inorganic insulating layer IN. Therefore, the protection pattern 190 may protect a side surface of each of the substrate 110 and the inorganic insulating layer IN so that the side surface of each of the substrate 110 and the inorganic insulating layer IN disposed outside more than the bank 110 is not exposed to the outside. At this time, the protection pattern 190 is disposed so as to be spaced apart from the plurality of pads PAD disposed on the inorganic insulating layer IN. As the protection pattern 190 is disposed on the inorganic insulating layer IN, the conductive adhesive layer AD is disposed on the protection pattern 190, but is not limited thereto.

In the display device 100 according to the exemplary embodiment of the present disclosure, the substrate 110 is formed of a transparent conductive oxide to reduce a thickness of the display device 100. In the related art, the plastic substrate has been mainly used as the substrate of the display device. However, the plastic substrate is formed by coating and curing a substrate material at a high temperature so that there are problems in that it takes a long time and it is difficult to form the thickness to be lower than a predetermined level. In contrast, the transparent conductive oxide may be formed to have a very thin thickness by the deposition process such as sputtering. Therefore, in the display device 100 according to the exemplary embodiment of the present disclosure, a substrate 110 which supports various components of the display device 100 is configured by the transparent conductive oxide to reduce a thickness of the display device 100 and implement a slim design.

Accordingly, in the display device 100 according to the exemplary embodiment of the present disclosure, the substrate 110 is formed of a transparent conductive oxide to improve the flexibility of the display device 100 and reduce the stress generated when the display device 100 is deformed. Specifically, when the substrate 110 is configured by the transparent conductive oxide, the substrate 110 may be formed as a very thin film. In this case, the substrate 110 may be also referred to as a first transparent thin film layer. Accordingly, the display device 100 including a substrate 110 may have a high flexibility and the display device 100 may be easily bent or rolled. Therefore, in the display device 100 according to the exemplary embodiment of the present disclosure, the substrate 110 is formed by the transparent conductive oxide to improve the flexibility of the display device 100. Accordingly, the stress generated when the display device 100 is deformed may be also relieved so that the crack caused in the display device 100 may be minimized or reduced.

Further, in the display device 100 according to the exemplary embodiment of the present disclosure, the substrate 110 is formed of a transparent conductive oxide to reduce the possibility of generating the static electricity in the substrate 110. If the substrate 110 is formed of plastic so that the static electricity is generated, various wiring lines and driving elements on the substrate 110 are damaged or the driving is affected due to the static electricity to degrade the display quality. Instead, when the substrate 110 is formed of the transparent conductive oxide, the static electricity generated in the substrate 110 may be minimized or reduced and a configuration for blocking and discharging the static electricity may be simplified. Accordingly, in the display device 100 according to the exemplary embodiment of the present disclosure, the substrate 110 is formed of the transparent conductive oxide having a low possibility of generating the static electricity. By doing this, the damage or the display quality degradation due to the static electricity may be minimized or reduced.

Further, in the display device 100 according to the exemplary embodiment of the present disclosure, the substrate 110 is formed of the transparent conductive oxide to minimize the permeation of the moisture or oxygen of the outside into the display device 100 by means of the substrate 110. When the substrate 110 is formed of the transparent conductive oxide, the substrate 110 is formed in the vacuum environment so that the foreign material generation possibility is significantly low. Further, even though the foreign material is generated, the size of the foreign material is very small so that the permeation of the moisture and oxygen into the display device 100 may be minimized or reduced.

Accordingly, in the display device 100 according to the exemplary embodiment of the present disclosure, the substrate 110 is formed of the transparent conductive oxide having a low possibility of generating the foreign materials and an excellent moisture permeation performance By doing this, the reliability of the light emitting diode OLED including an organic layer and the display device 100 may be improved.

In the display device 100 according to the exemplary embodiment of the present disclosure, the substrate 110 is formed of the transparent conductive oxide to attach a barrier film which is thin and chip below the substrate 110. When the substrate 110 is formed of a material having a low moisture permeation performance, for example, plastic, the moisture permeability may be supplemented by attaching a high-performance barrier film which is thick and expensive. However, in the display device 100 according to the exemplary embodiment of the present disclosure, the substrate 110 is formed of the transparent conductive oxide having an excellent moisture permeation performance so that a thin and cheap barrier film may be attached below the substrate 110. Accordingly, in the display device 100 according to the exemplary embodiment of the present disclosure, the substrate 110 is configured by the transparent conductive oxide having an excellent moisture permeation performance to reduce the manufacturing cost of the display device.

In the display device 100 according to the exemplary embodiment of the present disclosure, the substrate 110 is formed of the transparent conductive oxide to perform a LLO process. When the display device 100 is manufactured, a temporary substrate TS in which a sacrificial layer SCL is formed is attached below the substrate 110 and then the pixel unit 120 may be formed on the substrate 110. For example, the sacrificial layer SCL may use a hydrogenated amorphous silicon or an amorphous silicon which is hydrogenated and doped with impurities. Therefore, after completing the manufacturing of the display device 100, if the laser is irradiated from the lower portion of the temporary substrate TS, hydrogen of the sacrificial layer SCL is dehydrogenated and the sacrificial layer SCL and the temporary substrate TS may be separated from the substrate 110. At this time, the transparent conductive oxide is material which may perform the LLO process with the sacrificial layer SCL and the temporary substrate TS so that even though the substrate 110 is formed of the transparent conductive oxide, the substrate 110 may be easily separated from the temporary substrate TS. Accordingly, in the display device 100 according to the exemplary embodiment of the present disclosure, the substrate 110 is configured by the transparent conductive oxide which may perform the LLO process. Therefore, the display device 100 may be easily manufactured with the existing process and equipment.

In the meantime, various components are disposed above the substrate 110 of the display device 100. The substrate 110 and the inorganic insulating layer IN are generally formed with a material having a low rupture resistance so that when the substrate 110 and the inorganic insulating layer IN are disposed at the outermost side of the display device, the end of the inorganic insulting layer IN is cracked or the generated crack may easily propagate. Here, the rupture resistance refers to a resistance to rupture so that when the rupture resistance is high, it means that it is not easily ruptured even by a stress and when the rupture resistance is low, it means that it is easily ruptured by a stress. As described above, when the substrate 110 and the inorganic insulating layer IN of the display device are cracked, the reliability may be degraded and when cracks of the substrate 110 and the inorganic insulting layer IN propagate to the other wiring line or circuit, which results in a driving failure.

Therefore, in the display device 100 according to the exemplary embodiment of the present disclosure, ends of the substrate 110 and the inorganic insulating layer IN are disposed inside more than the outermost side of the display device 100 and the bank 115 is disposed at the outermost side of the display device. The bank 115 is formed of an organic material to have a higher rupture resistance than the substrate 110 and the inorganic insulating layer IN. Accordingly, in the display device 100 according to the exemplary embodiment of the present disclosure, rather than the substrate 110 and the inorganic insulating layer IN, the bank 115 is disposed at the outermost area so that the placement of the substrate 110 and the inorganic insulating layer IN having a low rupture resistance at the outermost side may be minimized Therefore, the generation and propagation of the crack in the outermost area of the display device 100 may be minimized or reduced.

Further, in the display device 100 according to the exemplary embodiment of the present disclosure, the protection pattern 190 is disposed to cover the end of the substrate 110 and the end of the inorganic insulating layer IN to minimize the crack generated on the side surface of the display device 100. Specifically, both the substrate 110 and the inorganic insulating layer IN which are formed of the crystallized transparent conductive oxide have low rupture resistance, but the protection pattern 190 formed of the amorphous transparent conductive oxide may have a relatively higher rupture resistance. Therefore, in the display device 100 according to the exemplary embodiment of the present disclosure, not the substrate 110, but the protection pattern 190 is disposed at the outermost side to improve the rupture resistance characteristic of the display device 100 and also improve the reliability of the display device 100. Further, the protection pattern 190 is also formed of the transparent conductive oxide, as the same as the substrate 110, so that the LLP process may be also easily performed. Further, the protection pattern 190 may be formed by the same process as the anode AN of the light emitting diode OLED simultaneously so that an additional process for forming the protection pattern 190 is not necessary, and the increase of the process cost and the process time may be minimized or reduced.

Hereinafter, the rupture characteristics of the substrate 110 formed of the crystallized transparent conductive oxide and the protection pattern 190 formed of the amorphous transparent conductive oxide will be described in detail.

Figure 8A:
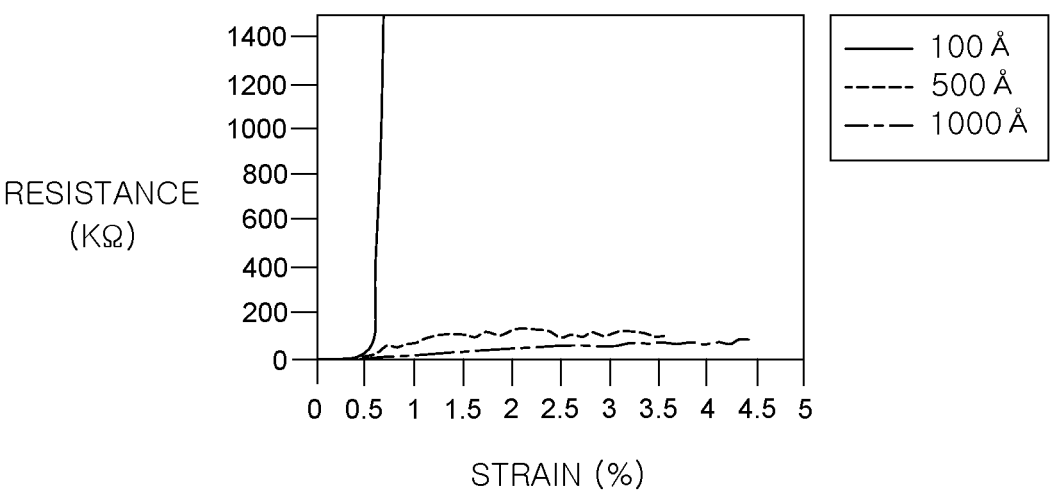
FIG. 8A is a graph measuring a rupture characteristic of a material which forms a substrate of a display device according to an exemplary embodiment of the present disclosure.
Figure 8B:
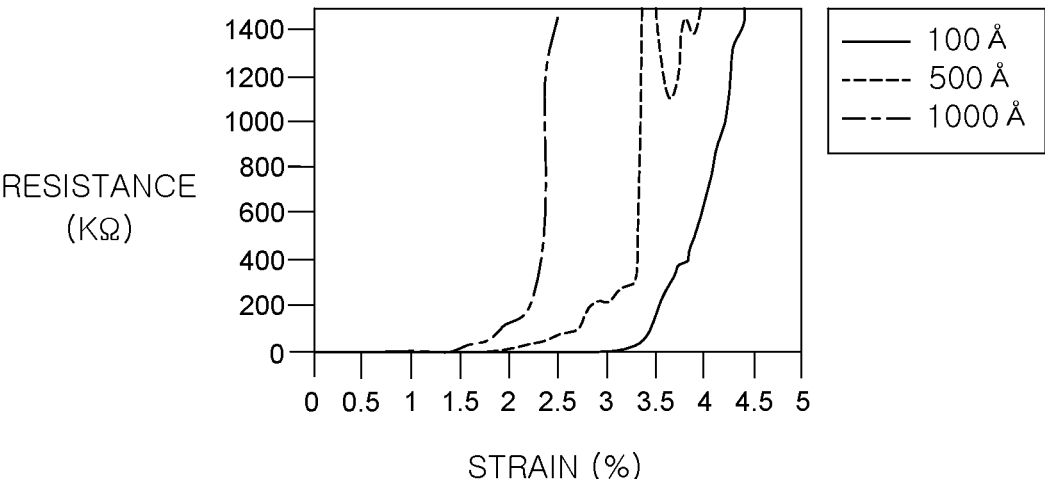
FIG. 8B is a graph measuring a rupture characteristic of a material which forms a protection pattern of a display device according to an exemplary embodiment of the present disclosure.

FIG. 8A is a graph measuring a rupture characteristic of a material which forms a substrate of a display device according to an exemplary embodiment of the present disclosure. FIG. 8B is a graph measuring a rupture characteristic of a material which forms a protection pattern of a display device according to an exemplary embodiment of the present disclosure. FIG. 8A is a graph measuring a rupture characteristic of a substrate 110 formed of the crystallized transparent conductive oxide and FIG. 8B is a graph measuring a rupture characteristic of the protection pattern 190 formed of an amorphous transparent conductive oxide. In the graphs of FIGS. 8A and 8B, an X-axis represents a length strain (%) when a stress is applied to each of the substrate 110 and a protection pattern 190 and a Y-axis represents an increased amount of a resistance (KΩ). At this time, in FIGS. 8A and 8B, the thickness of the substrate 110 and the protection pattern 190 was 100 Å, 500 Å, and 1000 Å which were measured three times. In this experiment, when the resistance started increasing, it meant that the characteristic of the substrate 110 or the protection pattern 190 has changed so that it meant that the substrate 110 or the protection pattern 190 were ruptured.

First, referring to FIG. 8A, in the case of the substrate 110 which is formed of the crystallized transparent conductive oxide, it is confirmed that in the thickness of 100 Å, the resistance starts increasing in the strain of approximately 0.6%, that in the thickness of 500 Å, the resistance starts increasing in the strain of approximately 0.7%, and that in the thickness of 1000 Å, the resistance starts increasing in the strain of approximately 0.1%.

Next, referring to FIG. 8B, it is confirmed that in the case of the protection pattern 190 which is formed of the amorphous transparent conductive oxide, it is confirmed that in the thickness of 100 Å, the resistance starts increasing in the strain of approximately 3.4%, that in the thickness of 500 Å, the resistance starts increasing in the strain of approximately 2.1%, and that in the thickness of 1000 Å, the resistance starts increasing in the strain of approximately 1.5%.

That is, referring to the experiment results of FIGS. 8A and 8B, it is confirmed that in the same thickness, the rupture resistance of the protection pattern 190 formed of the amorphous transparent conductive oxide is higher than the rupture resistance of the substrate 110 formed of the crystallized transparent conductive oxide.

Figure 9:
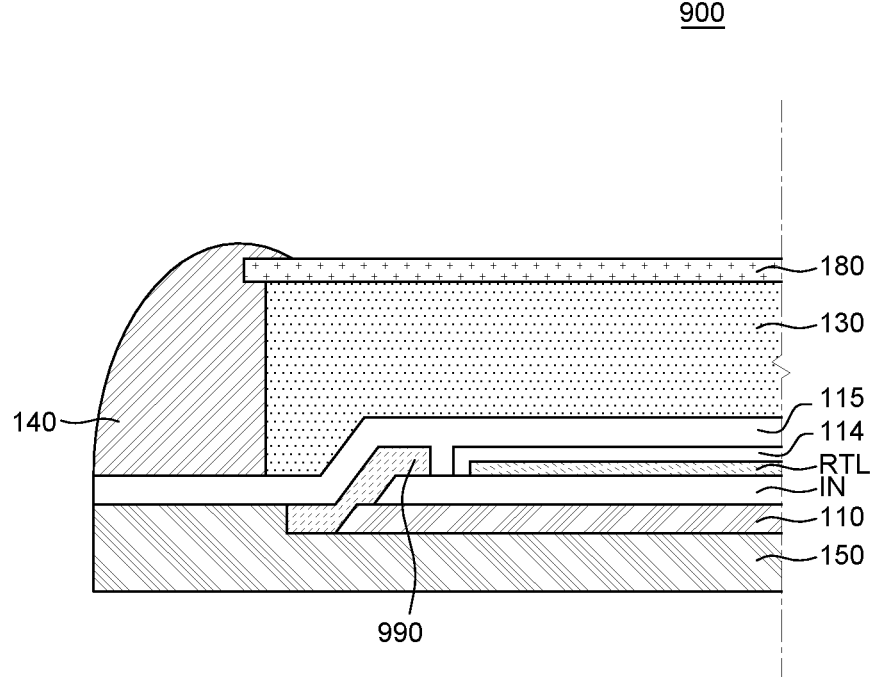
FIG. 9 is a cross-sectional view of a display device according to another exemplary embodiment of the present disclosure.

FIG. 9 is a cross-sectional view of a display device according to another exemplary embodiment of the present disclosure. The only difference between a display device 900 of FIG. 9 and the display device 100 of FIGS. 1 to 7B is a protection pattern 990, but the other configuration is substantially the same, so that a redundant description will be omitted.

Referring to FIG. 9, in the display device 900 according to another exemplary embodiment of the present disclosure, an end of the protection pattern 990 is disposed outside more than the end of the substrate 110. Specifically, a part of a top surface of a part of the protection pattern 990 which is located outside more than the end of the substrate 110 is an inclined surface and the other part is a plane extending in the same direction as the top surface of the substrate 110. Therefore, a part of the protection pattern 990 may be disposed on the substrate 110 and the other part may be disposed on the same plane as the substrate 110 so as to enclose the substrate 110.

Further, in the display device 900 according to another exemplary embodiment of the present disclosure, the protection pattern 990 is disposed to cover the end of the substrate 110 and the end of the inorganic insulating layer IN to minimize or at least reduce the crack generated on the side surface of the display device 900. Specifically, the protection pattern 990 includes a part which is disposed so as to enclose the substrate 110 on the same plane as the substrate 110. At this time, both the substrate 110 and the inorganic insulating layer IN which are formed of the crystallized transparent conductive oxide have relatively low rupture resistances, but the protection pattern 990 formed of the amorphous transparent conductive oxide has a relatively higher rupture resistance. Therefore, in the display device 900 according to another exemplary embodiment of the present disclosure, not the substrate 110, but the protection pattern 990 is disposed at the outermost side and specifically, the protection pattern 990 includes a part disposed to enclose the substrate 110 on the same plane as the substrate 110 to improve the rupture resistance characteristic of the display device 900 and also improve the reliability of the display device 900. Further, the protection pattern 990 is also formed of the transparent conductive oxide, as the same as the substrate 110, so that the LLP process may be also easily performed. Further, the protection pattern 990 may be formed by the same process as the anode AN of the light emitting diode OLED simultaneously so that an additional process for forming the protection pattern 990 is not necessary, and the increase of the process cost and the process time may be minimized or reduced.

Figure 10:
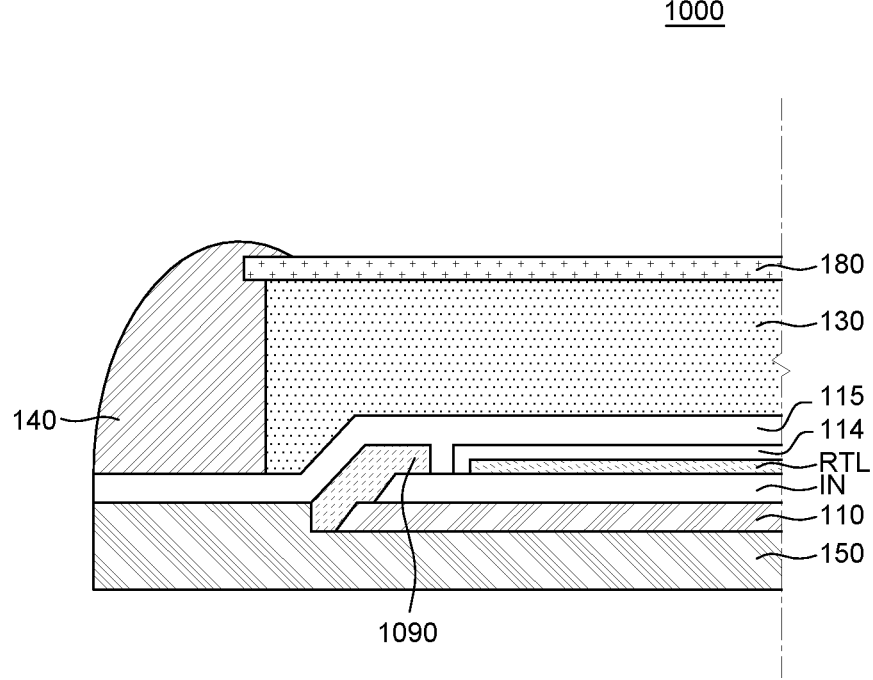
FIG. 10 is a cross-sectional view of a display device according to another exemplary embodiment of the present disclosure.

FIG. 10 is a cross-sectional view of a display device according to still another exemplary embodiment of the present disclosure. The only difference between a display device 1000 of FIG. 10 and the display device 100 of FIGS. 1 to 7B is a protection pattern 1090, but the other configuration is substantially the same, so that a redundant description will be omitted.

Referring to FIG. 10, the end of the protection pattern 1090 is disposed outside more than the end of the substrate. Specifically, a top surface of a part of the protection pattern 1090 which is located outside more than the end of the substrate 110 is an inclined surface and does not include a portion parallel to the top surface of the substrate 110. Therefore, the protection pattern 1090 may be disposed so as to cover the end of the substrate 110 and the end of the inorganic insulating layer IN.

Further, in the display device 1000 according to still another exemplary embodiment of the present disclosure, the protection pattern 1090 is disposed to cover the end of the substrate 110 and the end of the inorganic insulating layer IN to minimize the crack generated on the side surface of the display device 1000. Specifically, the protection pattern 1090 includes a part which is disposed so as to enclose the substrate 110 on the same plane as the substrate 110, but the corresponding part may be minimized or reduced. At this time, both the substrate 110 and the inorganic insulating layer IN which are formed of the crystallized transparent conductive oxide have relatively low rupture resistances, but the protection pattern 1090 formed of the amorphous transparent conductive oxide has a relatively higher rupture resistance. Therefore, in the display device 1000 according to still another exemplary embodiment of the present disclosure, not the substrate 110, but the protection pattern 1090 is disposed at the outermost side to improve the rupture resistance characteristic of the display device and also improve the reliability of the display device 1000. Specifically, the protection pattern 1090 minimizes a part which is disposed so as to enclose the substrate 110 on the same plane as the substrate 110 so that the placement of the protection pattern 1090 having a lower rupture resistance than the bank 115 may be also minimized or reduced. Further, the protection pattern 1090 is also formed of the transparent conductive oxide, as the same as the substrate 110, so that the LLP process may be also easily performed. Further, the protection pattern 1090 may be formed by the same process as the anode AN of the light emitting diode OLED simultaneously so that an additional process for forming the protection pattern 1090 is not necessary, and the increase of the process cost and the process time may be minimized or reduced.

Figure 11:
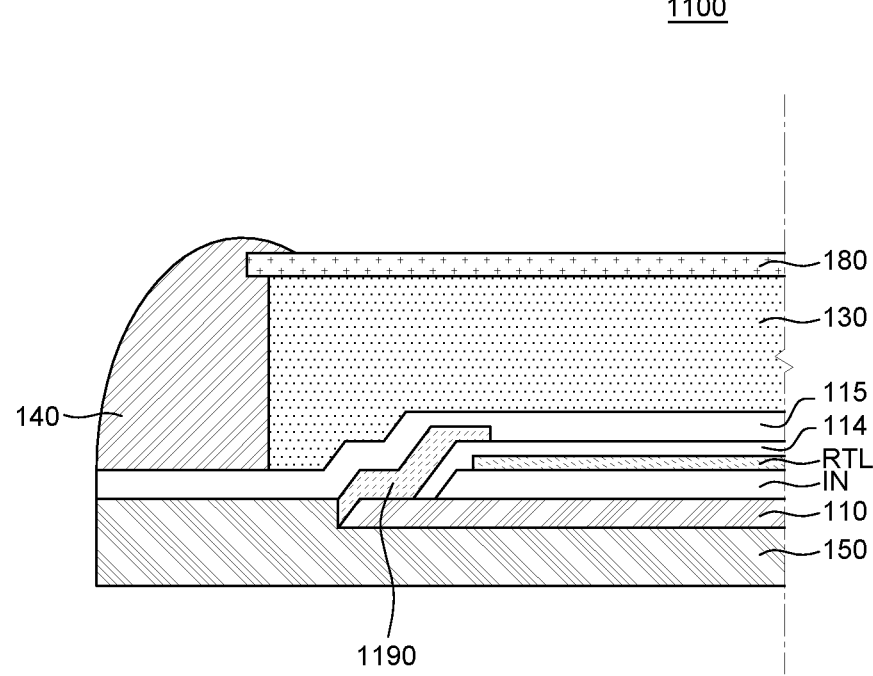
FIG. 11 is a cross-sectional view of a display device according to another exemplary embodiment of the present disclosure.

FIG. 11 is a cross-sectional view of a display device according to still another exemplary embodiment of the present disclosure. The only difference between a display device 1100 of FIG. 11 and the display device 100 of FIGS. 1 to 7B is a protection pattern 1190 and an over coating layer 114, but the other configuration is substantially the same, so that a redundant description will be omitted.

Referring to FIG. 11, an end of the over coating layer 114 is disposed to cover an end of the inorganic insulating layer IN. The end of the protection pattern 1190 is disposed to cover a side surface and a part of a top surface of the over coating layer 114. Further, the protection pattern 1190 may be disposed so as to cover the end of the substrate 110 and the end of the inorganic insulating layer IN. Therefore, the over coating layer 114 may primarily protect the end of the inorganic insulating layer IN and the protection pattern 1190 may secondarily protect the ends of the substrate 110 and the inorganic insulating layer IN.

In the display device 1100 according to still another exemplary embodiment of the present disclosure, the protection pattern 1190 which covers the end of the substrate 110 and the end of the inorganic insulating layer IN and the over coating layer 114 which covers the end of the inorganic insulating layer IN are disposed. By doing this, the crack generated on the side surface of the display device 1100 may be minimized or reduced. Specifically, both the substrate 110 and the inorganic insulating layer IN which are formed of the crystallized transparent conductive oxide have relatively low rupture resistances, but the protection pattern 1190 formed of the amorphous transparent conductive oxide has a relatively higher rupture resistance. Therefore, in the display device 1100 according to still another exemplary embodiment of the present disclosure, not the substrate 110, but the protection pattern 1190 is disposed at the outermost side to improve the rupture resistance characteristic of the display device 1100 and also improve the reliability of the display device 1100. Further, the protection pattern 1190 is also formed of the transparent conductive oxide, as the same as the substrate 110, so that the LLP process may be also easily performed. Further, the protection pattern 1190 may be formed by the same process as the anode AN of the light emitting diode OLED simultaneously so that an additional process for forming the protection pattern 1190 is not necessary, and the increase of the process cost and the process time may be minimized.

The exemplary embodiments of the present disclosure can also be described as follows:

According to an aspect of the present disclosure, a display device may comprise a substrate which includes an active area including a plurality of sub pixels and a non-active area enclosing the active area and is formed of transparent conductive oxide; an inorganic insulating layer disposed on the substrate; a protection pattern which is disposed so as to cover an end of the substrate and an end of the inorganic insulating layer; and an organic insulating layer which is disposed on the substrate, the inorganic insulating layer, and the protection pattern and extends to an outside of the substrate in a partial area.

The protection pattern may be formed of the transparent conductive oxide.

The substrate may be formed of crystallized transparent conductive oxide and the protection pattern is formed of amorphous transparent conductive oxide.

A part of a top surface of a part of the protection pattern which is located outside more than the end of the substrate may be an inclined surface and the other part may be a plane extending in the same direction as a top surface of the substrate.

The display device may further comprise an over coating layer disposed on the inorganic insulating layer.

An end of the over coating layer may be disposed on a top surface of the inorganic insulating layer.

The display device may further comprise a plurality of light emitting diodes disposed on the over coating layer.

The protection pattern may be formed of the same material as an anode of the plurality of light emitting diodes.

An end of the protection pattern and the end of the over coating layer may be spaced apart from each other.

The display device may further comprise an over coating layer disposed on the inorganic insulating layer.

An end of the over coating layer may be disposed so as to cover the end of the inorganic insulating layer.

An end of the protection pattern may be disposed so as to cover a side surface and a part of a top surface of the over coating layer.

The organic insulating layer may be a bank.

The display device may further comprise an encapsulation substrate which is opposite to the substrate; and a seal member which is disposed so as to cover a part of an end of the encapsulation substrate and a top surface of the organic insulating layer.

The display device may further comprise a plurality of pads which are disposed on the inorganic insulating layer in the non-active area; a plurality of flexible films which are disposed at one end of the substrate and is electrically connected to the plurality of pads to supply signals to the plurality of sub pixels; and a conductive adhesive layer which is disposed between the plurality of pads and the plurality of flexible films and electrically connects the plurality of pads and the plurality of flexible films.

The conductive adhesive layer may be disposed on the protection pattern.

The end of the inorganic insulating layer may be disposed inside more than the end of the substrate.

According to another aspect of the present disclosure, a display device may comprise a substrate which includes an active area including a plurality of sub pixels and a non-active area enclosing the active area and is formed of transparent conductive oxide; an inorganic insulating layer disposed on the substrate; a conductive pattern which is disposed so as to cover an end of the substrate and an end of the inorganic insulating layer and has one end disposed above the inorganic insulating layer; and an organic insulating layer which is disposed on the inorganic insulating layer and the conductive pattern and is disposed to extend from the active area to the non-active area, and extends to an outside of the substrate in a partial area.

The substrate may be formed of crystallized transparent conductive oxide and the conductive pattern may be formed of amorphous transparent conductive oxide.

An end of the conductive pattern may be disposed on the end of the substrate.

An end of the conductive pattern may be disposed outside more than the end of the substrate.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate comprising an active area including a plurality of sub pixels and a non-active area enclosing the active area, the substrate made of a transparent conductive oxide;
an inorganic insulating layer on the substrate;
a protection pattern that covers an end of the substrate and an end of the inorganic insulating layer; and
an organic insulating layer on the substrate, the inorganic insulating layer, and the protection pattern, the organic insulating layer extending to an outside of the substrate in a partial area.

2. The display device according to claim 1, wherein the protection pattern comprises the transparent conductive oxide.

3. The display device according to claim 2, wherein the substrate comprises a crystallized transparent conductive oxide and the protection pattern comprises an amorphous transparent conductive oxide.

4. The display device according to claim 1, wherein the protection pattern covers a side surface of the substrate, a side surface of the inorganic insulating layer, and a part of a top surface of the inorganic insulating layer extending from the side surface of the inorganic insulating layer.

5. The display device according to claim 1, wherein an end of the protection pattern is on a same straight line as the end of the substrate.

6. The display device according to claim 1, wherein an end of the protection pattern is outside more than the end of the substrate.

7. The display device according to claim 6, wherein a part of a top surface of a part of the protection pattern which is located outside more than the end of the substrate is an inclined surface and another part is a plane extending in a same direction as a top surface of the substrate.

8. The display device according to claim 1, further comprising:
an over coating layer on the inorganic insulating layer,
wherein an end of the over coating layer is on a top surface of the inorganic insulating layer.

9. The display device according to claim 8, further comprising:
a plurality of light emitting diodes on the over coating layer,
wherein the protection pattern comprises a same material as an anode of the plurality of light emitting diodes.

10. The display device according to claim 8, wherein an end of the protection pattern and the end of the over coating layer are spaced apart from each other.

11. The display device according to claim 1, further comprising:
an over coating layer on the inorganic insulating layer,
wherein an end of the over coating layer covers the end of the inorganic insulating layer.

12. The display device according to claim 11, wherein an end of the protection pattern is covers a side surface and a part of a top surface of the over coating layer.

13. The display device according to claim 1, wherein the organic insulating layer is a bank.

14. The display device according to claim 1, further comprising:
an encapsulation substrate which is opposite to the substrate; and
a seal member that covers a part of an end of the encapsulation substrate and a top surface of the organic insulating layer.

15. The display device according to claim 1, further comprising:

a plurality of pads on the inorganic insulating layer in the non-active area;

a plurality of flexible films at one end of the substrate, the plurality of flexible films electrically connected to the plurality of pads to supply signals to the plurality of sub pixels; and a conductive adhesive layer between the plurality of pads and the plurality of flexible films, the conductive adhesive layer electrically connecting the plurality of pads and the plurality of flexible films, wherein the conductive adhesive layer is on the protection pattern.

16. The display device according to claim 1, wherein the end of the inorganic insulating layer is inside more than the end of the substrate.

17. A display device, comprising:

a substrate comprising an active area including a plurality of sub pixels and a non-active area enclosing the active area, the substrate made of a transparent conductive oxide;

an inorganic insulating layer on the substrate;

a conductive pattern that covers an end of the substrate and an end of the inorganic insulating layer and has one end above the inorganic insulating layer;

an organic insulating layer on the inorganic insulating layer and the conductive pattern, the organic insulating layer extending from the active area to the non-active area and extending to an outside of the substrate in a partial area.

18. The display device according to claim 17, wherein the substrate comprises a crystallized transparent conductive oxide and the conductive pattern comprises an amorphous transparent conductive oxide.

19. The display device according to claim 17, wherein an end of the conductive pattern is on the end of the substrate.

20. The display device according to claim 17, wherein an end of the conductive pattern is outside more than the end of the substrate.

21. The display device according to claim 20, further comprising:

an over coating layer which covers the end of the inorganic insulating layer on the inorganic insulating layer, wherein an end of the conductive pattern covers a side surface and a part of a top surface of the over coating layer.

* * * * *